US012688831B2

(12) United States Patent　　　(10) Patent No.: US 12,688,831 B2
Feng et al.　　　　　　　　　　　(45) Date of Patent: *Jul. 21, 2026

(54) SHIFT REGISTER, GATE DRIVING CIRCUIT AND DISPLAY SUBSTRATE WITH CONDUCTIVE LINES BETWEEN OUTPUT TRANSISTOR AND CAPACITOR STRUCTURE

(71) Applicants:Hefei BOE Joint Technology Co., Ltd., Hefei (CN); BOE TECHNOLOGY GROUP CO., LTD., Beijing (CN)

(72) Inventors: Xuehuan Feng, Beijing (CN); Dacheng Zhang, Beijing (CN); Yongqian Li, Beijing (CN); Mingming Xie, Beijing (CN)

(73) Assignees: Hefei BOE Joint Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/030,782

(22) Filed: Jan. 17, 2025

(65) Prior Publication Data

US 2025/0166572 A1　　May 22, 2025

Related U.S. Application Data

(63) Continuation of application No. 18/284,899, filed as application No. PCT/CN2022/132819 on Nov. 18, 2022, now Pat. No. 12,236,885.

(30) Foreign Application Priority Data

Nov. 29, 2021　(CN) .......................... 202111435505.7

(51) Int. Cl.
　　*G09G 3/32* 　　　　(2016.01)
　　*G09G 3/3258* 　　　(2016.01)
　　　　　　　　(Continued)

(52) U.S. Cl.
　　CPC ......... *G09G 3/3258* (2013.01); *G09G 3/3291* (2013.01); *H10D 86/443* (2025.01);
　　　　　　　　(Continued)

(58) Field of Classification Search
　　CPC ............... G09G 3/3258; G09G 3/3291; G09G 2300/0861; G09G 2310/0286;
　　　　　　　　(Continued)

(56) References Cited

U.S. PATENT DOCUMENTS 12,236,885 B2 * 2/2025 Feng .................... G09G 3/3258
2020/0004075 A1 * 1/2020 Yoshida ............. G02F 1/13454
　　　　　　　　(Continued)

*Primary Examiner* — Liliana Cerullo
(74) *Attorney, Agent, or Firm* — HOUTTEMAN LAW LLC

(57)　　　　　　ABSTRACT

A shift register is provided to include a voltage control circuit coupled to an output control node; at least one driving output circuit, each including an output transistor and a capacitor structure sequentially arranged along a first direction; a first conductive line therebetween and extending along a second direction and coupled to a signal output line configured for the driving output circuit; the output transistor includes a gate electrode coupled to the output control node and a first voltage writing electrode of the capacitor structure, a first electrode coupled to a clock signal line configured for the driving output circuit and a second electrode coupled to the first conductive line; a second conductive line is disposed between the first conductive line and the capacitor structure, and the first conductive line is coupled to a second voltage writing electrode of the capacitor structure through the second conductive line.

20 Claims, 28 Drawing Sheets

(51) Int. Cl.

| | | |
|---|---|---|
| *G09G 3/3291* | (2016.01) | |
| *H10D 86/40* | (2025.01) | |
| *H10D 86/60* | (2025.01) | |
| *G11C 19/28* | (2006.01) | |

(52) U.S. Cl.
CPC ..... *H10D 86/60* (2025.01); *G09G 2300/0861* (2013.01); *G09G 2310/0286* (2013.01); *G09G 2310/08* (2013.01); *G11C 19/28* (2013.01)

(58) Field of Classification Search
CPC .. G09G 2310/08; G11C 19/28; G11C 19/184; H10D 86/443; H10D 86/60
See application file for complete search history.

(56) References Cited

U.S. PATENT DOCUMENTS

| 2021/0375186 A1* | 12/2021 | Wang | G11C 19/28 |
|---|---|---|---|
| 2021/0376057 A1* | 12/2021 | Liu | H10D 1/043 |
| 2022/0122505 A1* | 4/2022 | Gao | G11C 19/28 |
| 2023/0335065 A1* | 10/2023 | Guo | G06F 3/0412 |

* cited by examiner

LY1
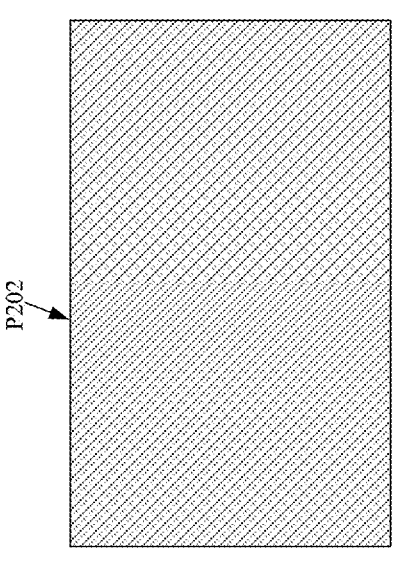
P202
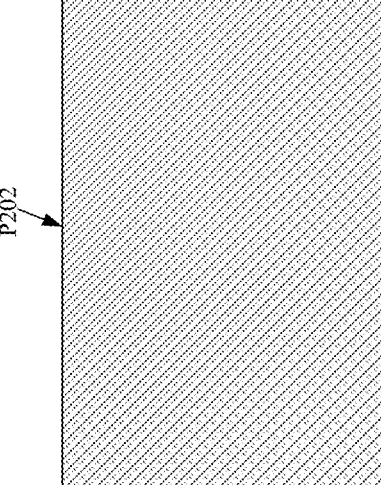
P202
FIG. 20B
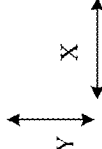
X
Y

LY2

LY4
K1
K2
K2
K1

FIG. 20E
X
Y
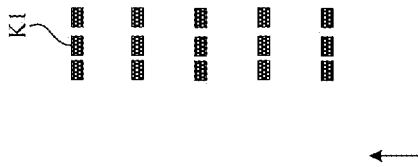

SHIFT REGISTER, GATE DRIVING CIRCUIT AND DISPLAY SUBSTRATE WITH CONDUCTIVE LINES BETWEEN OUTPUT TRANSISTOR AND CAPACITOR STRUCTURE

CROSS-REFERENCE TO RELATED APPLICATIONS

This is a continuation application of U.S. patent application Ser. No. 18/284,899, filed on Sep. 29, 2023, a National Phase Application filed under 35 U.S.C. 371 as a national stage of PCT/CN2022/132819, filed on Nov. 18, 2022, which claims the priority of the Chinese Patent Application No. 202111435505.7 entitled "shift register, gate driving circuit, and display substrate" and filed on Nov. 29, 2021, the content of which is incorporated herein by reference in its entirety.

TECHNICAL FIELD

The present disclosure relates to the display field, and in particular to a shift register, a gate driving circuit, and a display substrate.

BACKGROUND

In the display field, a design for a GOA (gate driving on array) circuit can realize a low cost and a narrow frame, and is widely used at present. It is necessary to design a capacitor structure in the design for the GOA circuit, the capacitor structure generally needs to occupy a larger area, and a short circuit of the capacitor is often caused by a small foreign particle, so that the operation of the GOA circuit is abnormal.

SUMMARY

In a first aspect, an embodiment of the present disclosure provides a shift register, including: a voltage control circuit coupled to an output control node and configured to control a voltage at the output control node; at least one driving output circuit, including: an output transistor and a capacitor structure arranged along a first direction; a first conductive line extending along a second direction is arranged between the output transistor and the capacitor structure, and is coupled to a signal output line configured for the driving output circuit; the output transistor includes a gate electrode, a first electrode and at least two second electrodes, the first electrode and the second electrode of the output transistor are alternately arranged in the second direction, the gate electrode of the output transistor is coupled to the output control node and a first voltage writing electrode of the capacitor structure, the first electrode of the output transistor is coupled to a clock signal line configured for the driving output circuit, and the second electrode of the output transistor is coupled to the first conductive line; and a second conductive line is disposed between the first conductive line and the capacitor structure, the first conductive line is coupled to a second voltage writing electrode of the capacitor structure by the second conductive line.

In some embodiments, the first conductive line is in the same layer as the second electrode of the output transistor.

In some embodiments, the second conductive line is in the same layer as the first conductive line.

In some embodiments, the capacitor structure includes: at least two capacitor units connected to each other in parallel;

first voltage writing electrodes of the capacitor units are coupled to the gate electrode of the output transistor, and second voltage writing electrodes of the capacitor units are coupled to the signal output line configured for the driving output circuit.

In some embodiments, in the capacitor structure, all the capacitor units are divided into at least two capacitor unit groups arranged along the second direction, and each capacitor unit group includes at least one capacitor unit; each capacitor unit group is configured with a corresponding second conductive line, and the second conductive lines corresponding to different capacitor unit groups are different; in the capacitor unit group, a second voltage writing electrode of the capacitor unit closest to the first conductive line is coupled to the first conductive line through the second conductive line corresponding to the capacitor unit group.

In some embodiments, at least two third conductive lines are disposed between the output transistor and the capacitor structure and in a one-to-one correspondence with the at capacitor unit groups; and a first voltage writing electrode of the capacitor unit closest to the first conductive line in the capacitor unit group is coupled to a gate electrode of the output transistor through the third conductive line corresponding to the capacitor unit group.

In some embodiments, the third conductive lines are disposed in the same layer as the gate electrode of the output transistor.

In some embodiments, the capacitor units in the capacitor structure are arranged in an array along the first direction and the second direction; first voltage writing electrodes of any two capacitor units adjacent to each other in the first direction or the second direction are coupled to each other through a fourth conductive line between the two adjacent capacitor units; and second voltage writing electrodes of any two capacitor units adjacent to each other in the first direction or the second direction are coupled to each other through a fifth conductive line between the two adjacent capacitor units.

In some embodiments, the fourth conductive line and the gate electrode of the output transistor are in the same layer; and the fifth conductive line and the second electrode of the output transistor are in the same layer.

In some embodiments, the shift register includes at least two driving output circuits, including a first driving output circuit and a second driving output circuit; the output transistor in the first driving output circuit, the capacitor structure in the first driving output circuit, the capacitor structure in the second driving output circuit, and the output transistor in the second driving output circuit are sequentially arranged along the second direction; and a first voltage writing electrode of the capacitor structure in the first driving output circuit and a first voltage writing electrode of the capacitor structure in the second driving output circuit are coupled to each other through a conductive structure between the capacitor structure in the first driving output circuit and the capacitor structure in the second driving output circuit.

In some embodiments, the capacitor structure includes: at least two capacitor units connected to each other in parallel, wherein a first voltage writing electrode of each capacitor unit is coupled to the gate electrode of the output transistor, and a second voltage writing electrode of each capacitor unit is coupled to the signal output line configured for the driving output circuit; in the capacitor structure, all the capacitor units are divided into at least two capacitor unit groups along the second direction, and each capacitor unit group includes at least one capacitor unit; the capacitor unit in the first driving output circuit is a first capacitor unit, and the capacitor unit in the second driving output circuit is a second capacitor unit; and for any one first capacitor unit and one second capacitor unit adjacent to each other in the first direction, wherein the first voltage writing electrode of the first capacitor unit and the first voltage writing electrode of the second capacitor unit are electrically connected to each other through the sixth conductive line between the first capacitor unit and the second capacitor unit. The conductive structure includes the sixth conductive line.

In some embodiments, the sixth conductive line is disposed in the same layer as the gate electrode of the output transistor.

In some embodiments, the first voltage writing electrode is a single-layer structure; the first voltage writing electrode and the gate electrode of the output transistor are in the same layer; and the second voltage writing electrode is a single-layer structure, and the second voltage writing electrode and the second electrode of the output transistor are in the same layer.

Alternatively, the second voltage writing electrode is of a double-layer structure, the output transistor further includes an active layer, the second electrode of the output transistor is on a side of the gate electrode of the output transistor away from the active layer of the output transistor, a light shielding pattern at least covering a channel region of the active layer is arranged on a side of the active layer of the output transistor away from the gate electrode of the output transistor, and a material of the light shielding pattern includes a conductive material; the second voltage writing electrode includes a first conductive pattern and a second conductive pattern which are stacked, the first conductive pattern and the second electrode of the output transistor are arranged in the same layer, the second conductive pattern and the light shielding pattern are arranged in the same layer, and the first conductive pattern is coupled to the second conductive pattern.

In a second aspect, an embodiment of the present disclosure further provides a gate driving circuit, including: a plurality of shift registers in cascade, wherein at least one of the plurality of shift registers employs the shift register as provided in the first aspect.

In a third aspect, an embodiment of the present disclosure further provides a display substrate, including: the gate driving circuit as provided in the second aspect.

BRIEF DESCRIPTION OF DRAWINGS

FIGS. 20B to 20G are schematic diagrams of layouts of layers with some layers stacked in FIG. 20A;

DETAIL DESCRIPTION OF EMBODIMENTS

In order to enable one of ordinary skill in the art to better understand the technical solutions of the present disclosure, a shift register, a gate driving circuit and a display substrate provided by the present disclosure will be described in further detail with reference to the accompanying drawings.

A transistor involved in the embodiments of the present disclosure may be a thin film transistor or a field effect transistor or other device having the same or similar characteristics. A source electrode and a drain electrode of the transistor are symmetric to each other, there is no difference between the source electrode and the drain electrode. In the embodiments of the present disclosure, in order to distinguish the source electrode and the drain electrode of the transistor, one of the source electrode and the drain electrode is referred to as a first electrode, and the other one of the source electrode and the drain electrode is referred to as a second electrode. For example, the source electrode is referred to as a first electrode and the drain electrode is referred to as a second electrode.

Figure 1:
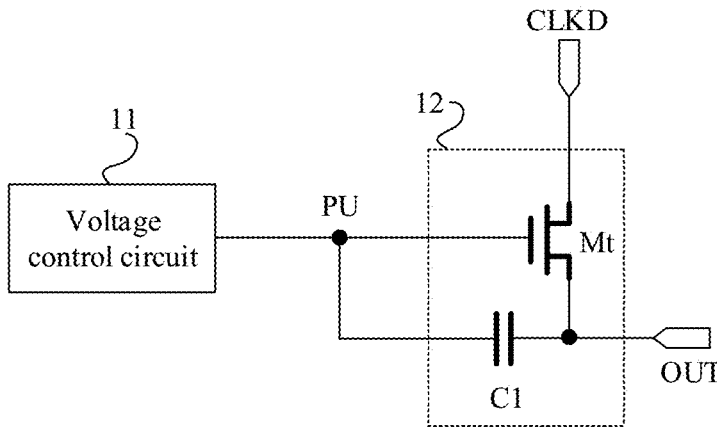
FIG. 1 is a schematic diagram of a circuit structure of a shift register according to the present disclosure.

FIG. 1 is a schematic diagram of a circuit structure of a shift register according to the present disclosure. As shown in FIG. 1, the shift register includes: a voltage control circuit 11 and at least one driving output circuit 12. The voltage control circuit 11 is coupled to an output control node PU and configured to control a voltage at the output control node PU; the driving output circuit 12 is coupled to the output control node PU, a corresponding clock signal line CLKD, and a corresponding signal output line OUT, and is configured to write a clock signal (as a driving signal) provided in the corresponding clock signal line CLKD to the corresponding signal output line OUT in response to control of a voltage at the output control node PU. The driving output circuit 12 includes: an output transistor Mt and a capacitor structure C1, two voltage writing electrodes of the capacitor structure C1 are respectively coupled to the output control node PU and a corresponding signal output line OUT.

The output transistor Mt outputs a driving signal to the corresponding signal output line OUT through a second electrode of the output transistor Mt to drive a pixel unit located in a display region, so that it is required for the output transistor Mt to have a high driving capability. Therefore, when the output transistor Mt is designed, the output transistor Mt is often designed as a double-channel transistor or a multi-channel transistor. Accordingly, in one or more embodiments, at least two second electrodes for outputting the driving signal to the corresponding signal output lines OUT may be arranged on the output transistor Mt.

It should be noted that FIG. 1 only exemplarily shows that the shift register includes one driving output circuit 12, which is only exemplary, and does not limit the technical solution of the present disclosure.

Figure 2:
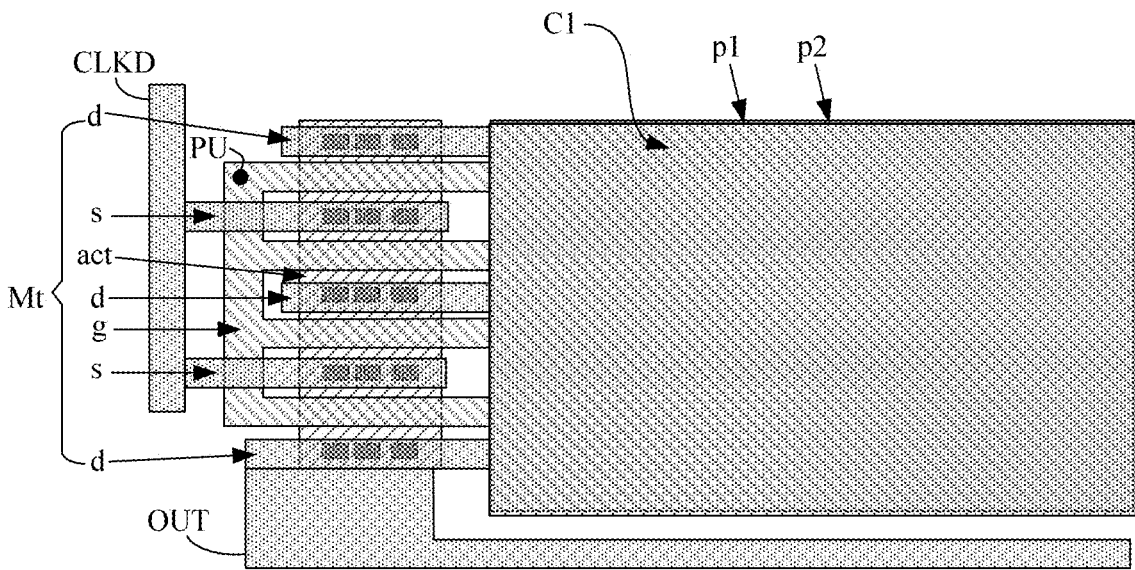
FIG. 2 is a schematic diagram of a layout of a driving output circuit in the related art.
Figure 3:
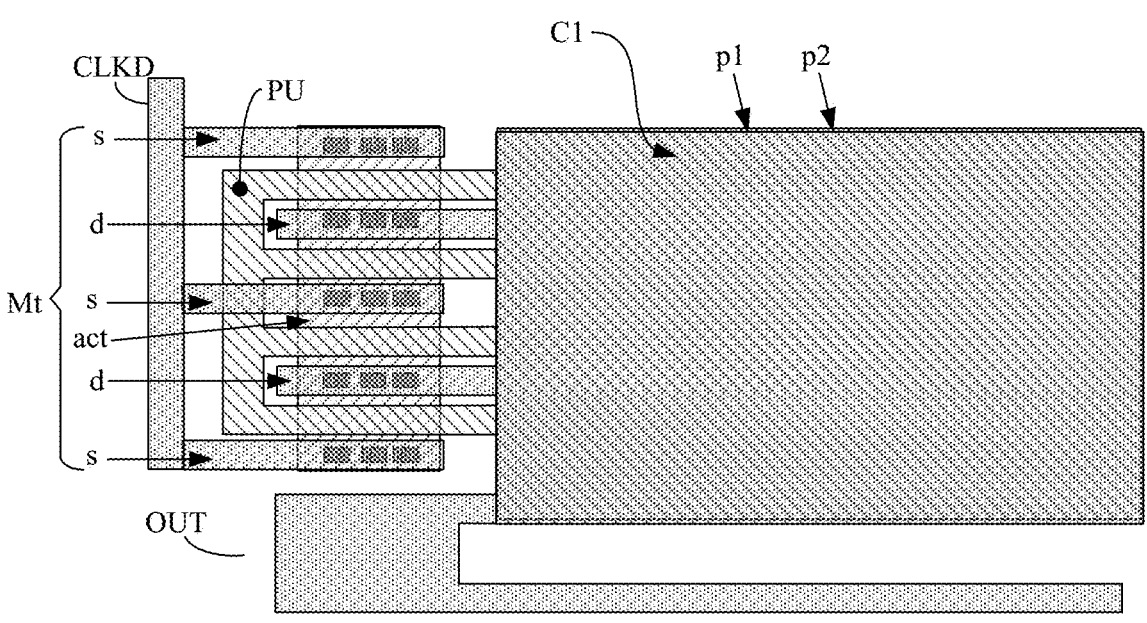
FIG. 3 is a schematic diagram of another layout of a driving output circuit in the related art.

FIG. 2 is a schematic diagram of a layout of a driving output circuit in the related art; FIG. 3 is a schematic diagram of another layout of a driving output circuit in the related art. As shown in FIGS. 2 and 3, in the related art, the second electrodes d of the output transistor Mt respectively extend directly to be directly connected to a second voltage writing electrode p2 in the capacitor structure C1; the signal output line OUT provided for the driving output circuit is directly connected to one second electrode d (see FIG. 2) of the output transistor Mt or the second voltage writing electrode p2 (see FIG. 3) in the capacitor structure C1.

A first electrode s and the second electrode d of the output transistor Mt included in the driving output circuit shown in FIGS. 2 and 3 may be regarded as interdigital electrodes, and a plurality of branches included in the two interdigital electrodes are alternately arranged. As shown in FIG. 2, the first electrode s includes two branches, and the second electrode d includes three branches; as shown in FIG. 3, the first electrode s includes three branches, and the second electrode d includes two branches; the output transistor Mt in FIGS. 2 and 3 is a four-channel transistor.

Figure 4:
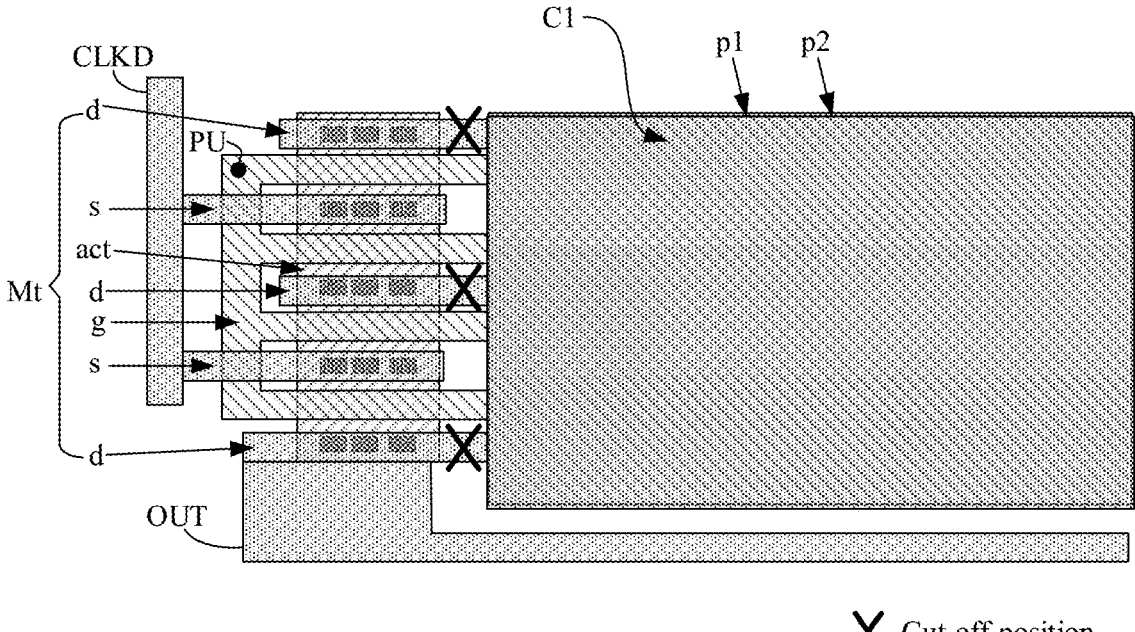
FIG. 4 is a schematic diagram illustrating the driving output circuit of FIG. 2 undergoing a maintenance process in the related art.
Figure 5:
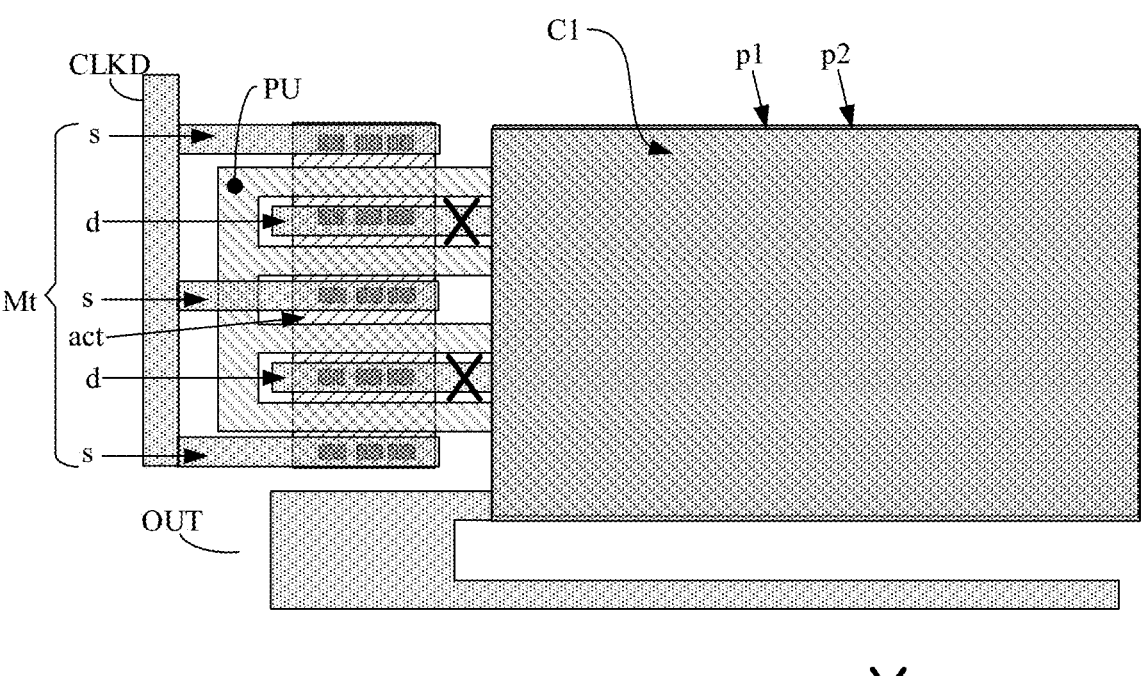
FIG. 5 is a schematic diagram illustrating the driving output circuit of FIG. 3 undergoing a maintenance process in the related art.

FIG. 4 is a schematic diagram of the driving output circuit of FIG. 2 undergoing a maintenance process in the related art; FIG. 5 is a schematic diagram of the driving output circuit of FIG. 3 undergoing a maintenance process in the related art. As shown in FIGS. 4 and 5, in the related art, when an abnormality in the capacitor structure C1 is caused by a foreign particle on the capacitor structure C1, it is difficult to repair the shift register. This is because when the capacitor structure C1 with the short-circuit abnormality is subjected to a maintenance process, it is necessary to cut off the portion of each second electrode d extending to be directly connected to the second voltage writing electrode p2 in the capacitor structure C1.

After the cutting-off process, in the case shown in FIG. 4, only the second electrode d directly connected to the signal output line OUT may write the driving signal to the corresponding signal output line OUT, and at this time, the driving capability of the output transistor Mt obviously cannot meet the actual driving requirement; after the cutting-off process, in the case shown in FIG. 5, no second electrode d may write the driving signal to the corresponding signal output line OUT, that is, the output transistor Mt cannot output the driving signal to the corresponding signal output line OUT. As can be seen, in the related art, when an abnormality occurs in the capacitor structure C1, it is difficult to effectively maintain the shift register during the operation of the shift register.

Figure 6A:
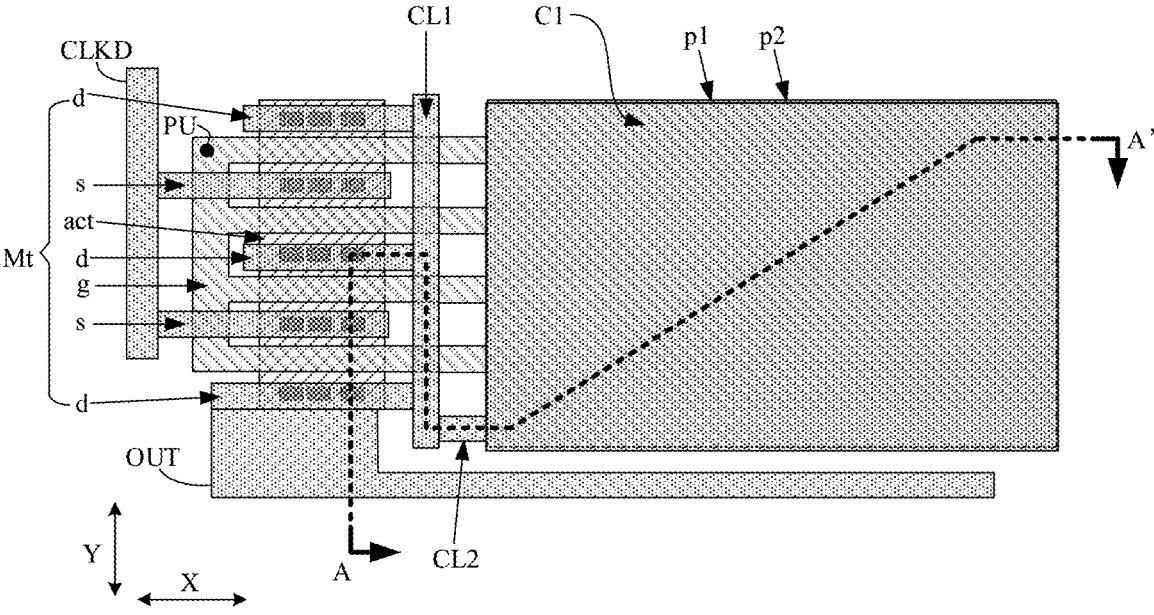
FIG. 6A and FIG. 6B are schematic diagrams of two different layouts of a driving output circuit according to an embodiment of the present disclosure, respectively.
Figure 6B:
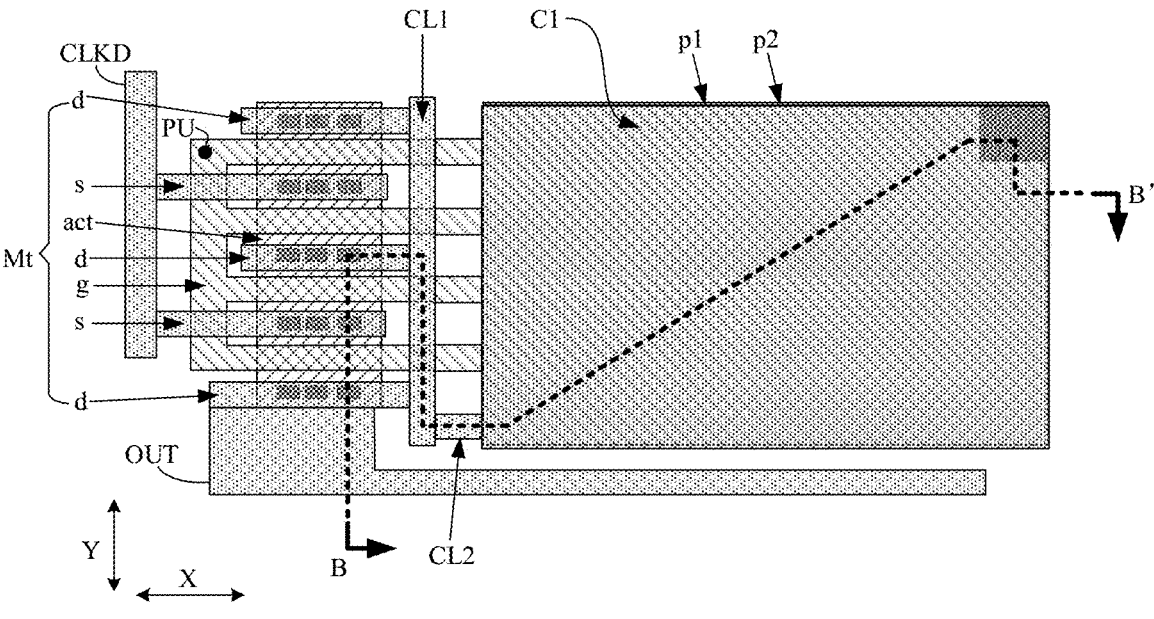
Figure 6C:
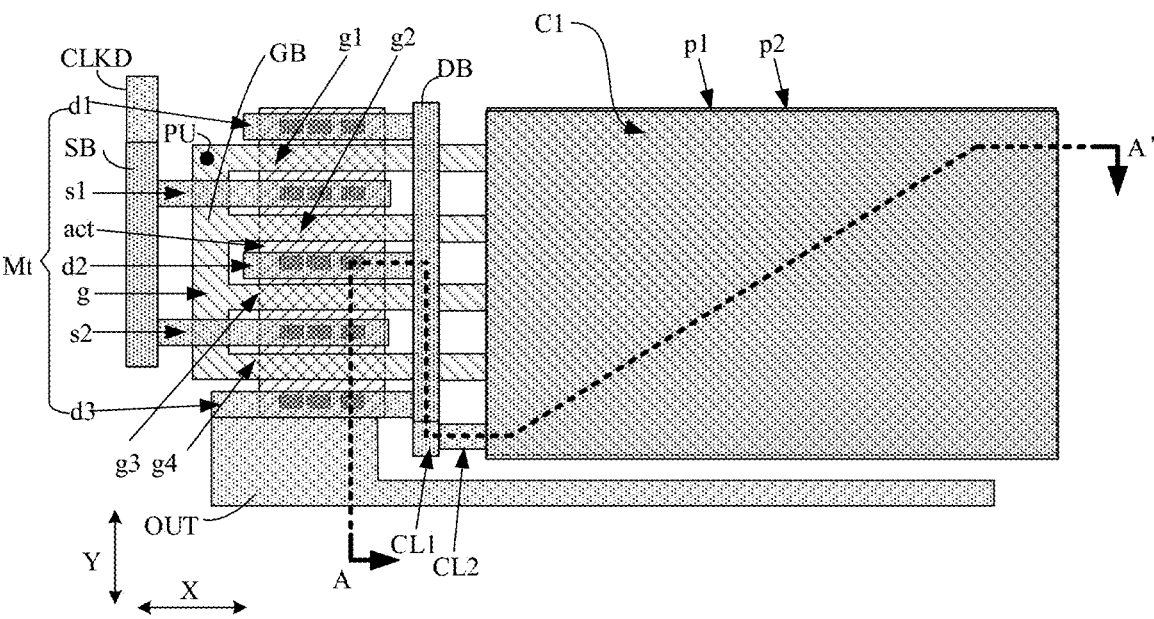
FIG. 6C and FIG. 6D are schematic diagrams of two different layouts of a driving output circuit according to an embodiment of the present disclosure, respectively.
Figure 6D:
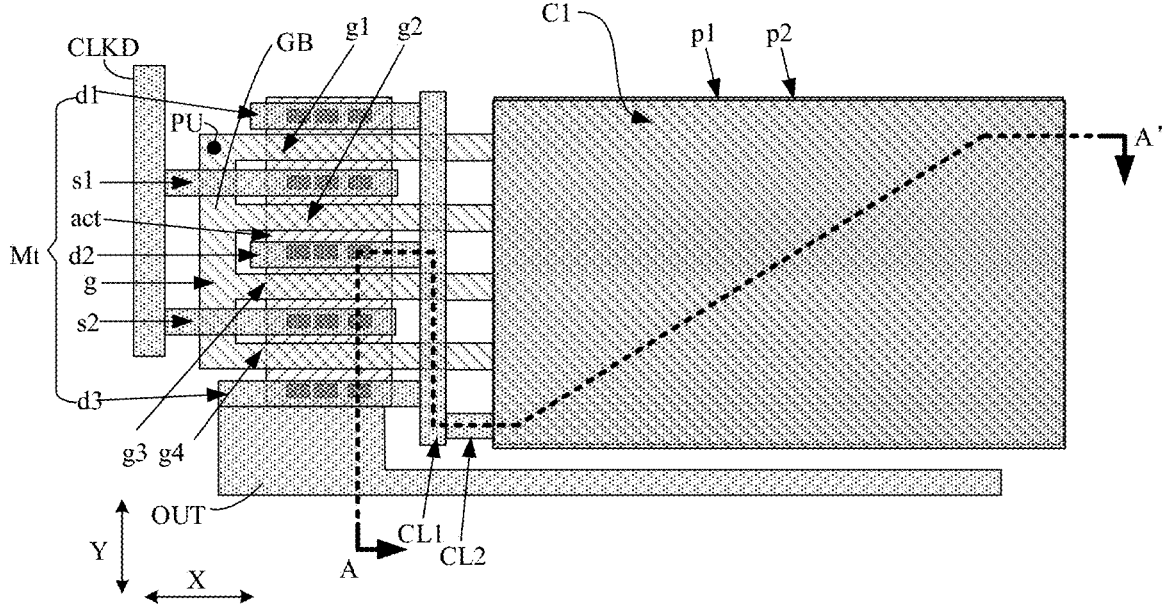
Figure 7:
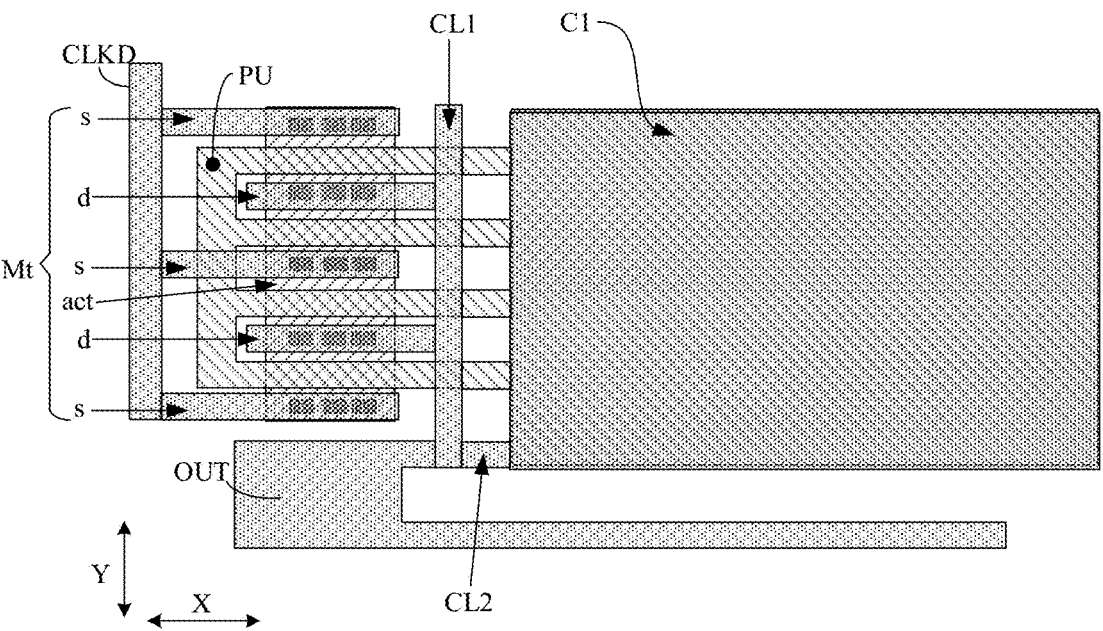
FIG. 7 is a schematic diagram of another layout of a driving output circuit according to an embodiment of the present disclosure.

FIG. 6A and FIG. 6B are schematic diagrams of two different layouts of a driving output circuit according to an embodiment of the present disclosure, respectively; FIG. 6C and FIG. 6D are schematic diagrams of two different layouts of a driving output circuit according to an embodiment of the present disclosure, respectively; FIG. 7 is a schematic diagram of another layout of a driving output circuit according to an embodiment of the present disclosure. As shown in FIG. 1, FIG. 6A, FIG. 6B, FIG. 6C, FIG. 6D, and FIG. 7, in the shift register provided in the embodiment of the present disclosure, the driving output circuit 12 includes: the output transistor Mt and the capacitor structure C1 arranged along a first direction X (e.g., a row direction in the drawing), a first conductive line CL1 extending along a second direction Y (e.g., a column direction in the drawing) is arranged between the output transistor Mt and the capacitor structure C1, and is coupled to the signal output line OUT configured for the driving output circuit.

The output transistor Mt includes a gate electrode g, a first electrode s and a second electrode d; the first electrode s of the output transistor Mt and the second electrode d of the output transistor Mt are alternately arranged in the second direction Y; the gate electrode g of the output transistor Mt is coupled to the output control node PU and a first voltage writing electrode p1 of the capacitor structure C1; the first electrode s of the output transistor Mt is coupled to the clock signal line CLKD configured for the driving output circuit; and the second electrode d of the output transistor Mt is coupled to the first conductive line CL1.

In the embodiments shown in FIGS. 6A, 6B, 6C and 6D, the first and second electrodes s, d of the output transistor Mt each include a plurality of branches. Specifically, the first electrode s includes a plurality of first branch portions, the second electrode d includes a plurality of second branch portions, and the plurality of first branch portions and the plurality of second branch portions are alternately arranged. As shown in FIGS. 6A, 6B, 6C, and 6D, the plurality of first branch portions and the plurality of second branch portions extend substantially along the first direction X and are alternately arranged along the second direction Y; the gate electrode g includes a plurality of third branch portions; an orthographic projection of each third branch portion on the base is located between orthographic projections of the first branch portion and the second branch portion adjacent to each other on the base, thereby forming a multi-channel transistor.

Specifically, as shown in FIG. 6C, the first electrode s may include a first main portion SB and two first branch portions s1, s2; the second electrode d may include a second main portion DB and three second branch portions d1, d2, d3; the gate electrode g may include a third main portion GB and four third branch portions g1, g2, g3, and g4. As shown in FIG. 6C, the two first branch portions s1, s2, the three second branch portions d1, d2, d3, and the four third branch portions g1, g2, g3, and g4 extend substantially along the first direction X, and are alternately arranged along the second direction Y. As shown, an orthographic projection of each of the four third branch portions g1, g2, g3 and g4 on the base is located between orthographic projections of the first branch portion and second branch portion adjacent to each other on the base, and overlaps with an orthographic projection of an active layer act on the base in a direction perpendicular to the base, thereby forming a four-channel transistor. In the embodiment shown in FIG. 6C, the first electrode s of the output transistor Mt is coupled to the clock signal line CLKD configured for the driving output circuit through the first main portion SB of the first electrode s, and the second electrode d of the output transistor Mt is coupled to the first conductive line CL1 through the second main portion DB of the second electrode d.

In the embodiment shown in FIG. 6D, the first main portion SB and the clock signal line CLKD have a one-piece structure, i.e., the plurality of first branch portions s1, s2 may be regarded as being directly coupled to the clock signal line CLKD; the second main portion DB and the first conductive line CL1 have a one-piece structure, that is, the plurality of second branch portions d1, d2, d3 are directly coupled to the first conductive line CL1.

In the embodiment shown in FIGS. 6A to 6D, orthographic projections of the first main portion SB, the second main portion DB, the third main portion GB, the clock signal line CLKD, and the first conductive line CL1 on the base extend substantially along the second direction Y; the plurality of first branch portions and the plurality of second branch portions are alternately arranged along the second direction Y between the first conductive line CL1 and the clock signal line CLKD, and orthographic projections of the plurality of third branch portions on the base are sequentially arranged along the second direction Y between the orthographic projections of the third main portion GB and the first conductive line CL1 on the base.

A second conductive line CL2 is disposed between the first conductive line CL1 and the capacitor structure C1, and the first conductive line CL1 is coupled to a second voltage writing electrode p2 of the capacitor structure C1 through the second conductive line CL2.

It should be noted that FIGS. 6A, 6B, 6C, and 6D show that the signal output line OUT configured for the driving output circuit is directly connected to one second electrode d of the output transistor Mt, and FIG. 7 shows that the signal output line OUT configured for the driving output circuit is directly connected to the second voltage writing electrode in the capacitor structure C1.

The driving output circuit shown in FIGS. 6A to 6D is different from the driving output circuit shown in FIG. 7 in that in the driving transistor in FIGS. 6A to 6D, the first electrode s includes the two first branch portions, the second electrode d includes the three second branch portions, and the gate electrode g includes the four third branch portions, so that the driving transistor shown in FIGS. 6A to 6D is the four-channel transistor; in the driving transistor in FIG. 7, the first electrode s includes three first branch portions, the second electrode d includes two branch portions, and the gate electrode g includes four fourth branch portions, so that the driving transistor shown in FIG. 7 is a four-channel transistor.

Figure 8:
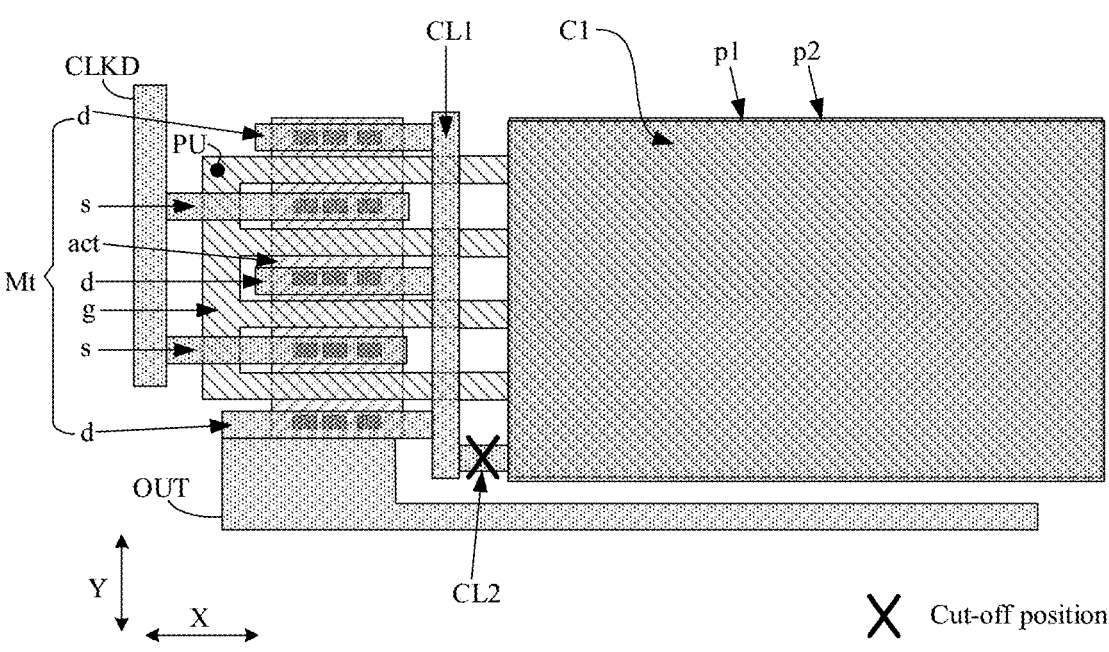
FIG. 8 is a schematic diagram illustrating the driving output circuit of FIG. 6A undergoing a maintenance process.
Figure 9:
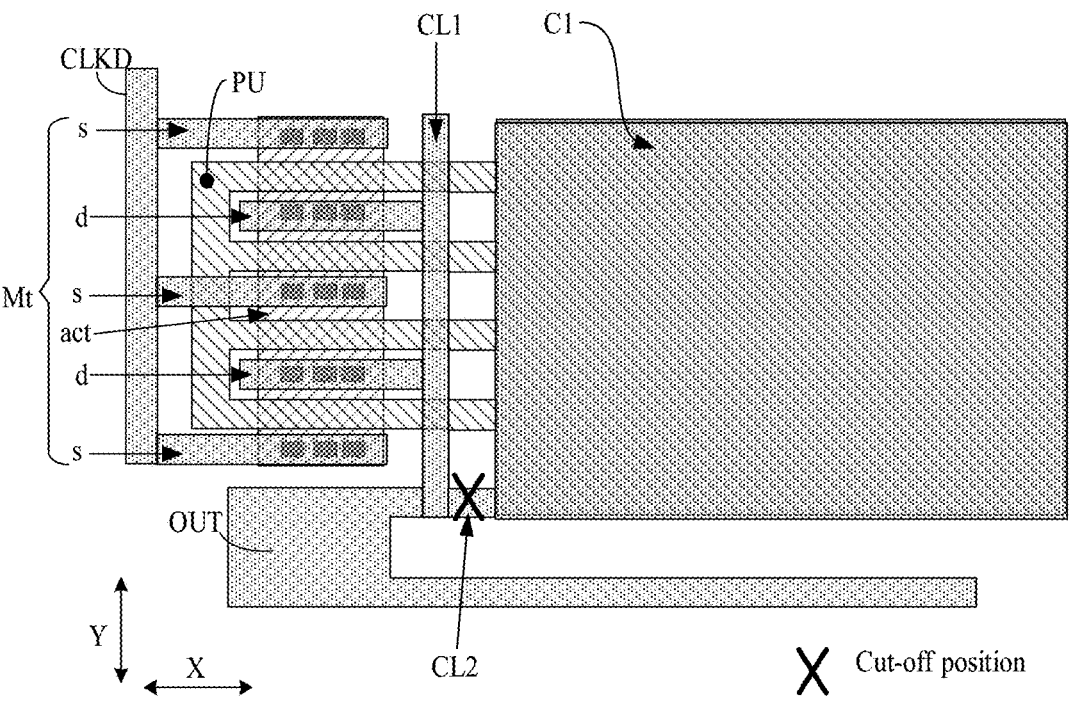
FIG. 9 is a schematic diagram illustrating the driving output circuit of FIG. 7 undergoing a maintenance process.

FIG. 8 is a schematic diagram of the driving output circuit of FIG. 6A undergoing a maintenance process; FIG. 9 is a schematic diagram of the driving output circuit of FIG. 7 undergoing a maintenance process. As shown in FIGS. 8 and 9, in the present disclosure, when it is necessary to perform maintenance processing on the abnormal capacitor structure C1, it is only necessary to cut off the second conductive line CL2 located between the first conductive line CL1 and the capacitor structure C1.

After the second conductive line CL2 is cut off, each second electrode d of the output transistor Mt in the driving output circuit shown in FIGS. 8 and 9 may write a driving signal to the corresponding signal output line OUT through the first conductive line CL1, that is, the normal output function of the output transistor Mt can be ensured while the capacitor structure C1 in the shift register is maintained.

Figure 10:
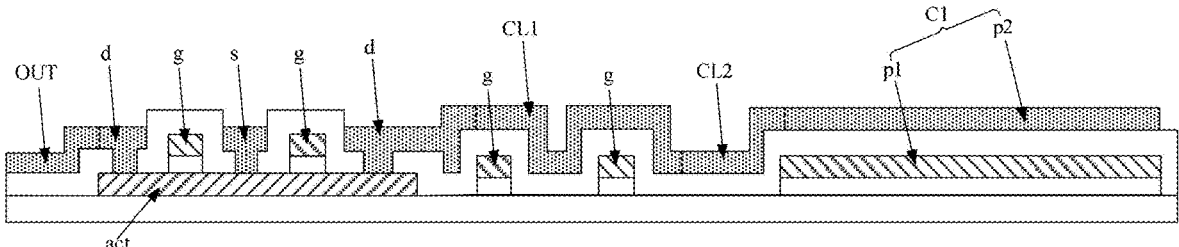
FIG. 10 is a schematic cross-sectional view of the driving output circuit of FIG. 6A along a direction A-A'.
Figure 11:
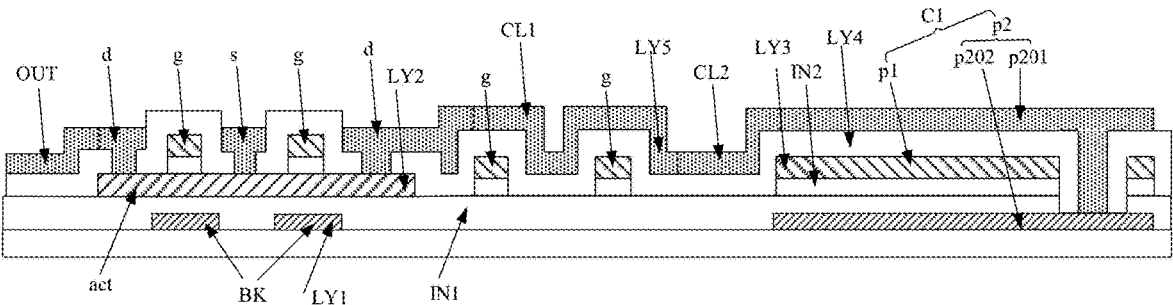
FIG. 11 is a schematic cross-sectional view of the driving output circuit of FIG. 6B along a direction B-B'.

FIG. 10 is a schematic cross-sectional view of the driving output circuit of FIG. 6A along a direction A-A'; FIG. 11 is a schematic cross-sectional view of the driving output circuit of FIG. 6B along a direction B-B'. As shown in FIG. 11, in some embodiments, the first conductive line CL1 is disposed in the same layer as the second electrode d of the output transistor Mt.

It should be noted that two structures are disposed in the same layer in the embodiment of the present disclosure, which means that the two structures are formed by patterning a thin film layer of the same material; that is, the two structures may be formed simultaneously by patterning the thin film layer of the same material.

In the embodiment of the present disclosure, the first conductive line CL1 and the second electrode d of the output transistor Mt are disposed in the same layer, that is, based on the existing manufacturing process for forming the second electrode d of the output transistor Mt, the first conductive line CL1 can be simultaneously formed in the process for forming the second electrode d only by adjusting a mask used in the manufacturing process to a certain extent; therefore, the provision of the first conductive line CL1 cannot increase the number of manufacturing processes.

In some embodiments, the second conductive line CL2 is disposed in the same layer as the first conductive line CL1. Similarly, based on this design, the provision of the second conductive line CL2 cannot increase the number of manufacturing processes.

Referring to FIG. 10, in some embodiments, the first voltage writing electrode p1 is a single-layer structure, and is disposed in the same layer as the gate electrode of the output transistor Mt; the second voltage writing electrode p2 is a single-layer structure, and is disposed in the same layer as the second electrode d of the output transistor Mt. That is, the capacitor structure C1 shown in FIG. 10 is a double-layer structure.

In the present disclosure, the single-layer structure of the first voltage writing electrode p1 and/or the second voltage writing electrode p2 may include a light shielding pattern, which may be conductive or non-conductive.

Referring to FIG. 11, in some embodiments, the first voltage writing electrode p1 is a single-layer structure, and is disposed in the same layer as the gate electrode of the output transistor Mt; the second voltage writing electrode p2 is a double-layer structure, and includes a first conductive pattern p201 and a second conductive pattern p202 which are stacked. The output transistor Mt further includes an active layer act, and the second electrode d of the output transistor Mt is on a side of the gate electrode g of the output transistor Mt away from the active layer of the output transistor Mt; a second insulating layer IN2 is provided between the gate electrode g and the active layer act, and a third insulating layer LY4 is provided between the gate electrode g and the first/second electrodes s, d of the output transistor Mt. A light shielding pattern BK covering at least a channel region of the active layer act is provided on a side of the active layer act of the output transistor Mt away from the gate electrode g of the output transistor Mt, and is made of a conductive material. At this time, the first conductive pattern p201 is disposed in the same layer as the second electrode d of the output transistor Mt, the second conductive pattern p202 is disposed in the same layer as the light shielding pattern BK, and the first conductive pattern p201 is coupled to the second conductive pattern p202 through a via. In the embodiment of FIG. 11, the first conductive pattern p201 is coupled to the second conductive pattern p202 through a via extending through the first insulating layer IN1, the second insulating layer IN2, the first conductive layer LY3, and the third insulating layer LY3. That is, the capacitor structure C1 shown in FIG. 11 is a three-layer structure.

In the case where areas of the first voltage writing electrodes shown in FIGS. 10 and 11 are equal to each other, a capacitance of the capacitor structure C1 shown in FIG. 11 is about 2 times a capacitance of the capacitor structure C1 shown in FIG. 10.

Figure 12A:
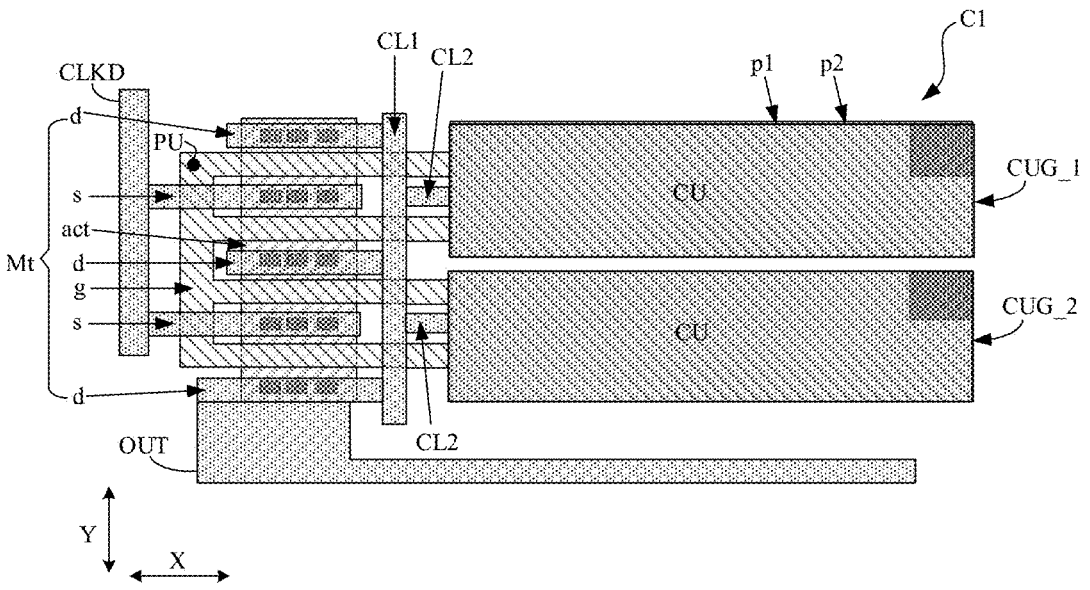
FIG. 12A is a schematic diagram of yet another layout of a driving output circuit according to an embodiment of the present disclosure.

FIG. 12A is a schematic diagram of yet another layout of a driving output circuit according to an embodiment of the present disclosure. As shown in FIG. 12A, unlike the previous embodiments, the capacitor structure C1 in the embodiment of the present disclosure includes: at least two capacitor units CU connected to each other in parallel, a first voltage writing electrode p1 of each capacitor unit CU is coupled to the gate electrode g of the output transistor Mt, and a second voltage writing electrode p2 of each capacitor unit CU is coupled to the signal output line OUT configured for the driving output circuit.

In practical applications, the capacitor structure C1 in one driving output circuit occupies a large area, and a size of the foreign particle is relatively small, so that when the foreign particle falls on a capacitor structure C1, the whole capacitor structure C1 is usually cut off. The inventors believe that such the maintenance manner of cutting off the whole capacitor structure C1 should be improved. Specifically, the embodiment of the present disclosure improves the capacitor structure C1, such that the maintenance manner when the foreign particle falls on the capacitor structure C1 is changed.

Specifically, in the embodiment of the present disclosure, one large-sized capacitor structure C1 is designed to be a structure in which at least two small-sized capacitor units CU are connected to each other in parallel. When a foreign particle falls on a small-sized capacitor unit CU, only the small-sized capacitor unit CU needs to be cut off, and the small-sized capacitor unit CU that is not cut off in the capacitor structure C1 may still operate normally.

In some embodiments, in the capacitor structure C1, all capacitor units CU are divided into at least two capacitor unit groups CUG_1, CUG_2 arranged along the second direction Y, each of the capacitor unit groups CUG_1, CUG_2 includes at least one capacitor unit CU; each of the capacitor unit groups CUG_1, CUG_2 is configured with a corresponding second conductive line CL2 and different capacitor unit groups CUG_1, CUG_2 are configured with different second conductive lines CL2; in each capacitor unit group, the second voltage writing electrode p2 of the capacitor unit CU closest to the first conductive line CL1 is coupled to the first conductive line CL1 through the second conductive line CL2 corresponding to the capacitor unit group.

Figure 12B:
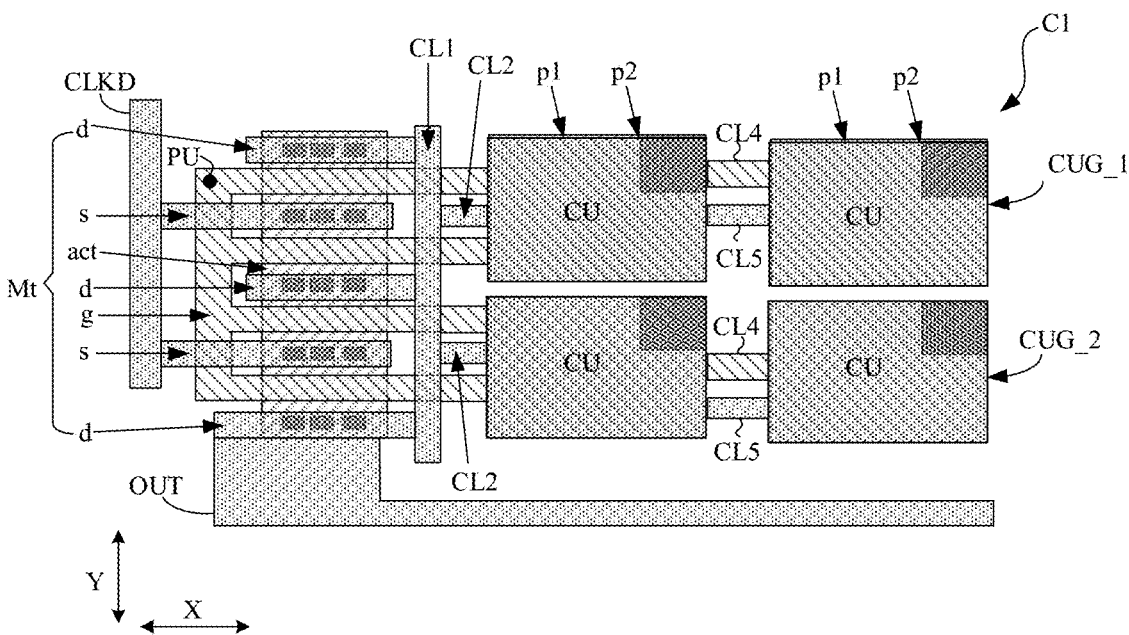
FIG. 12B is a schematic diagram of yet another layout of a driving output circuit according to an embodiment of the present disclosure.

It should be noted that FIG. 12A only exemplarily shows that the capacitor structure C1 includes two capacitor unit groups CUG_1 and CUG_2, and each capacitor unit group includes one capacitor unit CU. In the embodiment of the present disclosure, each capacitor unit group may also include a plurality of capacitor units arranged in the first direction and connected in parallel to each other. As shown in FIG. 12B, the first and second capacitor unit groups CUG_1 and CUG_2 each include two capacitor units CU connected in parallel along the first direction X, first voltage writing electrodes p1 of the two capacitor units CU are coupled to each other through a fourth conductive line CL4; and second voltage writing electrodes p2 of the two capacitor units CU are coupled to each other through a fifth conductive line CL5.

Figure 13:
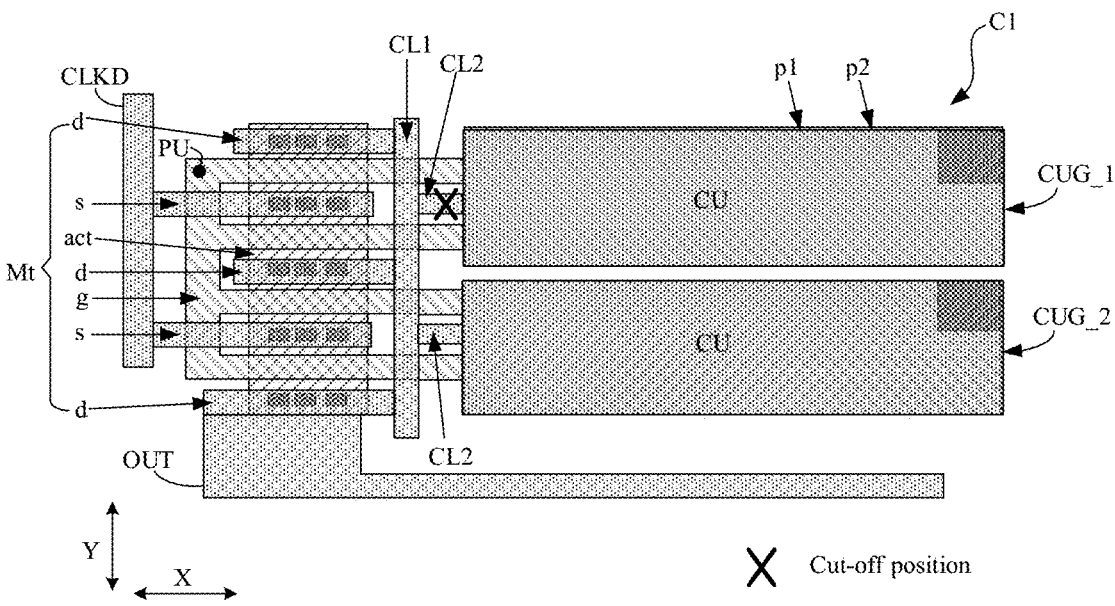
FIG. 13 is a schematic diagram illustrating the driving output circuit of FIG. 12A undergoing a maintenance process.

FIG. 13 is a schematic diagram of the driving output circuit of FIG. 12A undergoing a maintenance process. As shown in FIG. 13, as an example, when a foreign particle falls in the first capacitor unit group CUG_1, the second conductive line CL2 corresponding to the first capacitor unit group CUG_1 is only necessarily cut off. At this time, the second conductive line CL2 corresponding to the second capacitor unit group CUG_2 without a falling foreign particle remains intact, and the capacitor units CU in the second capacitor unit group CUG_2 may operate normally.

Figure 14:
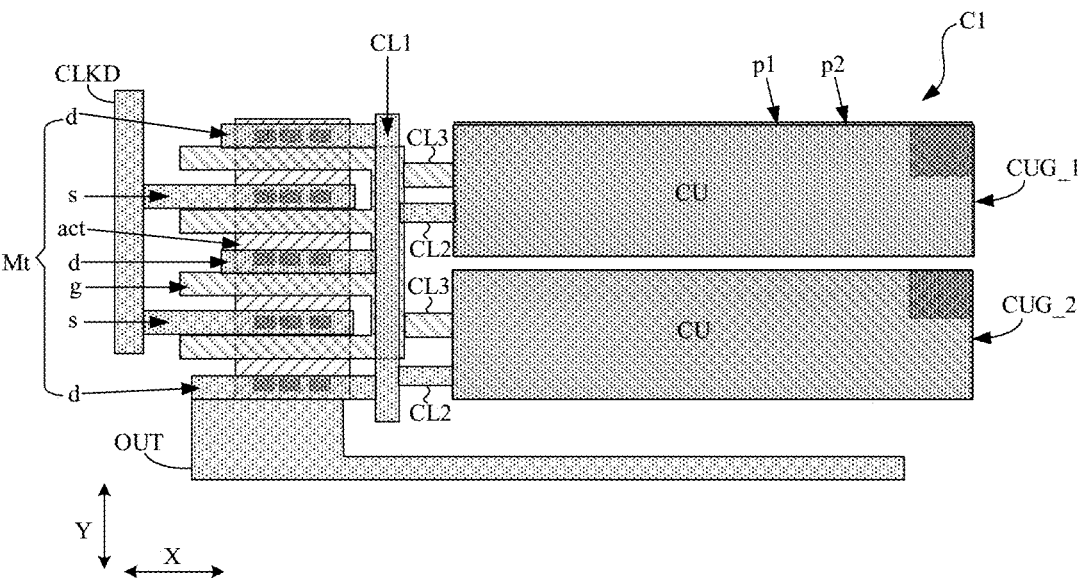
FIG. 14 is a schematic diagram of still another layout of a driving output circuit according to an embodiment of the present disclosure.

FIG. 14 is a schematic diagram of still another layout of a driving output circuit according to an embodiment of the present disclosure. As shown in FIG. 14, in some embodiments, two third conductive lines CL3 are further disposed between the output transistor Mt and the capacitor structure C1 and are in one-to-one correspondence with the first and second capacitor unit groups CUG_1 and CUG_2; the first voltage writing electrode p1 of the capacitor unit CU closest to the first conductive line CL1 in each of the first and second capacitor unit groups CUG_1 and CUG_2 is coupled to the gate electrode of the output transistor Mt through the third conductive line CL3 corresponding to the capacitor unit group.

In the embodiment shown in FIG. 14, an orthographic projection of the third main portion (a gate main portion) included in the gate electrode g of the output transistor Mt in the driving output circuit on the base is closer to an orthographic projection of the capacitor structure C1 on the base than an orthographic projection of the third branch portion (a gate branch portion) on the base. Therefore, the third branch portion of the gate electrode g does not extend to the first voltage writing electrode p1 of the capacitor structure C1, and is not coupled to the first voltage writing electrode p1 of the capacitor structure C1. Therefore, in this embodiment, it is necessary to additionally provide the third conductive lines CL3 to couple each capacitor unit CU to the gate electrode g.

In the embodiment of the present disclosure, when a foreign particle falls on the capacitor unit in one capacitor unit group, the capacitor unit group may be cut off by not only cutting off the second conductive line CL2 corresponding to the capacitor unit group (i.e., the cutting off manner shown in FIG. 13), but also cutting off the third conductive line CL3 corresponding to the capacitor unit group. Only the case of cutting off the third conductive line CL3 corresponding to the capacitor unit group will be described in detail below.

Figure 15:
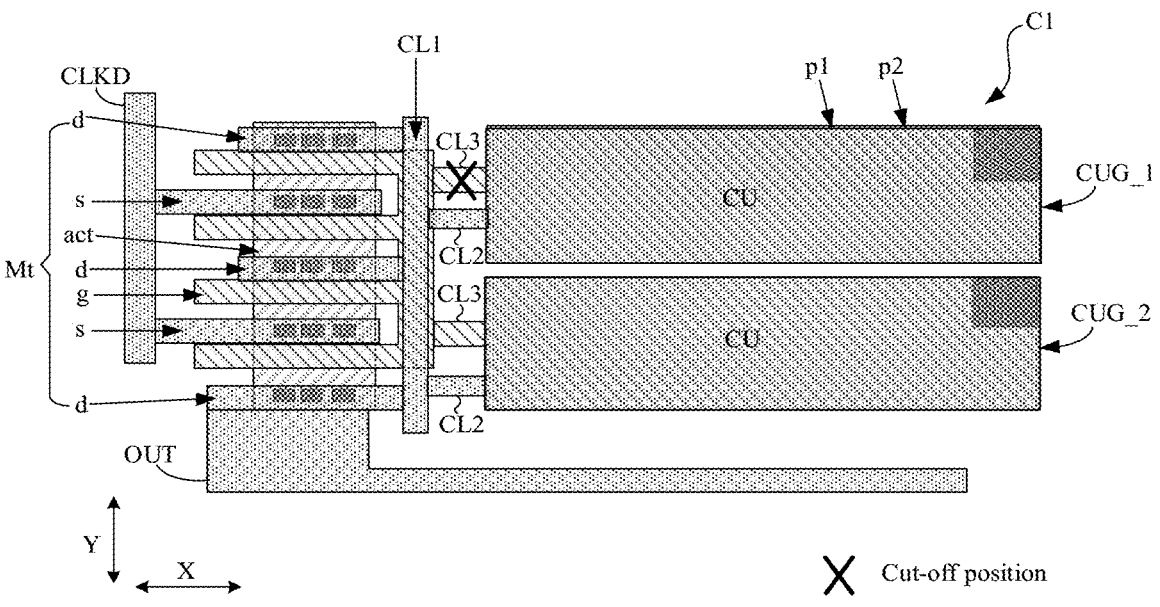
FIG. 15 is a schematic diagram illustrating the driving output circuit of FIG. 14 undergoing a maintenance process.

FIG. 15 is a schematic diagram of the driving output circuit of FIG. 14 undergoing a maintenance process. As shown in FIG. 15, as an example, when a foreign particle falls in the capacitor unit CU in the first capacitor unit group CUG_1, it is only necessary to cut off the third conductive line CL3 corresponding to the first capacitor unit group CUG_1. At this time, the third conductive line CL3 corresponding to the second capacitor unit group CUG_2 without a falling foreign particle remains intact, and the capacitor units CU in the second capacitor unit group CUG_2 may operate normally.

Alternatively, in some embodiments, when a foreign particle falls on the capacitor unit in the capacitor unit group, the second conductive line CL2 and the third conductive line CL3 corresponding to the capacitor unit group may be cut off at the same time to ensure the normal operation of other elements.

In some embodiments, the third conductive line CL3 is disposed in the same layer as the gate electrode g of the output transistor Mt. Based on this design, the provision of the third conductive lines CL3 cannot increase the number of manufacturing processes.

Figure 16:
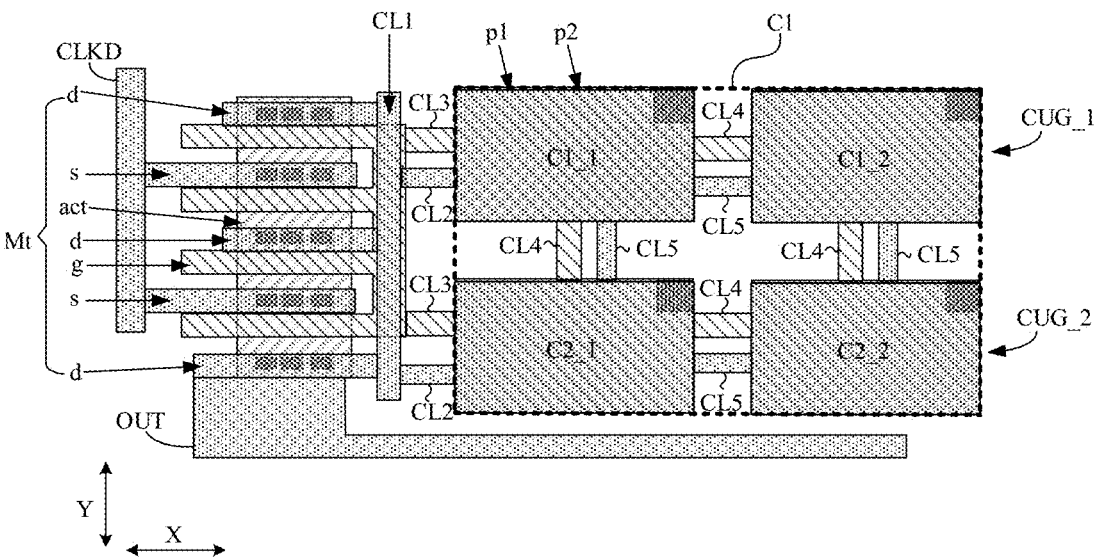
FIG. 16 is a schematic diagram of still another layout of a driving output circuit according to an embodiment of the present disclosure.

FIG. 16 is a schematic diagram of still another layout of a driving output circuit according to an embodiment of the present disclosure. As shown in FIG. 16, in some embodiments, a plurality of capacitor units C1_1, C1_2, C2_1, and C2_2 in the capacitor structure C1 are arranged in an array along the first direction X and the second direction Y; the first voltage writing electrodes p1 of any two capacitor units adjacent to each other in the first direction X or in the second direction Y are coupled to each other through a fourth conductive line CL4 located between the adjacent two capacitor units; the second voltage writing electrodes p2 of any two capacitor units adjacent to each other in the first direction X or in the second direction Y are coupled to each other through a fifth conductive line CL5 located between the adjacent two capacitor units.

Figure 22:
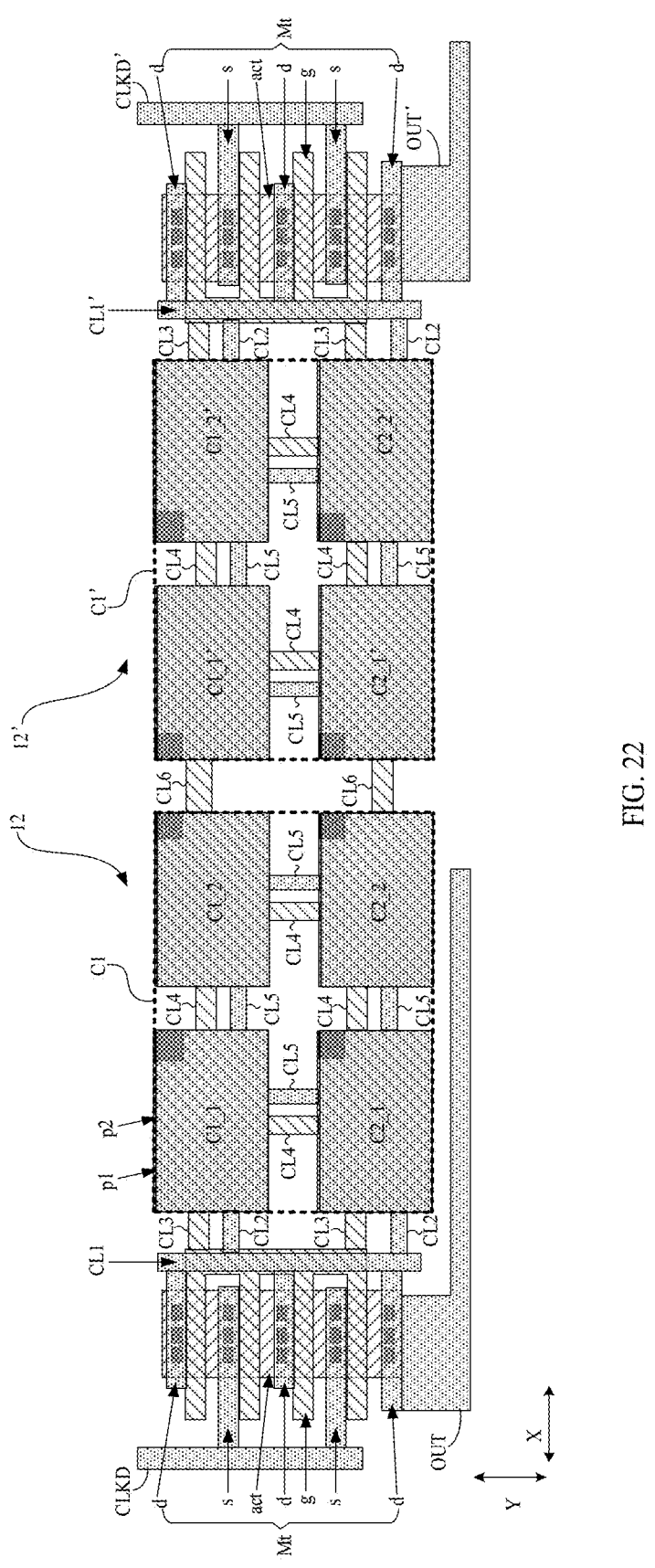
FIG. 22 is a schematic diagram of a layout of a first driving output circuit and a second driving output circuit in a shift register according to an embodiment of the present disclosure.

Unlike the cutting off the capacitor structure C1 or the capacitor unit groups CUG_1 and CUG_2 as a unit in the previous embodiments, the capacitor units may be cut off as a unit based on the capacitor structure C1 provided in this embodiment. Specifically, when a foreign particle falls on one capacitor unit, all the conductive lines connected to the first voltage writing electrode p1 of the capacitor unit (the conductive lines connected to the first voltage writing electrode p1 of each capacitor unit include at least the fourth conductive line CL4, and the first voltage writing electrode p1 of the capacitor unit adjacent to the first conductive line CL1 in the first direction X is further connected to the third conductive line CL3; in the subsequent embodiments, the first voltage writing electrode p1 of each of some capacitor units is further connected to a sixth conductive line CL6, which is shown in FIG. 22, but not shown in FIG. 16) may be cut off, and/or all the conductive lines connected to the second voltage writing electrode p2 of the capacitor unit (the conductive lines connected to the second voltage writing electrode p2 of each capacitor unit include at least a fifth conductive line CL5, and the second voltage writing electrode p2 of the capacitor unit adjacent to the first conductive line CL1 in the first direction X is further connected to the second conductive line CL2) may be cut off.

In some embodiments, like the third conductive line CL3, the fourth conductive line CL4 is disposed in the same layer as the gate electrode g of the output transistor Mt; like the second conductive line CL2, the fifth conductive line CL5 is disposed in the same layer as the second electrode d of the output transistor Mt. Based on this design, the provision of the fourth conductive line CL4 and the fifth conductive line CL5 cannot increase the number of manufacturing processes.

FIG. 16 exemplarily shows that the capacitor units C1_1, C1_2, C2_1 and C2_2 in the capacitor structure C1 are arranged in a 2×2 matrix, which is only illustrative, and does not limit the technical solution of the present disclosure.

Figure 17:
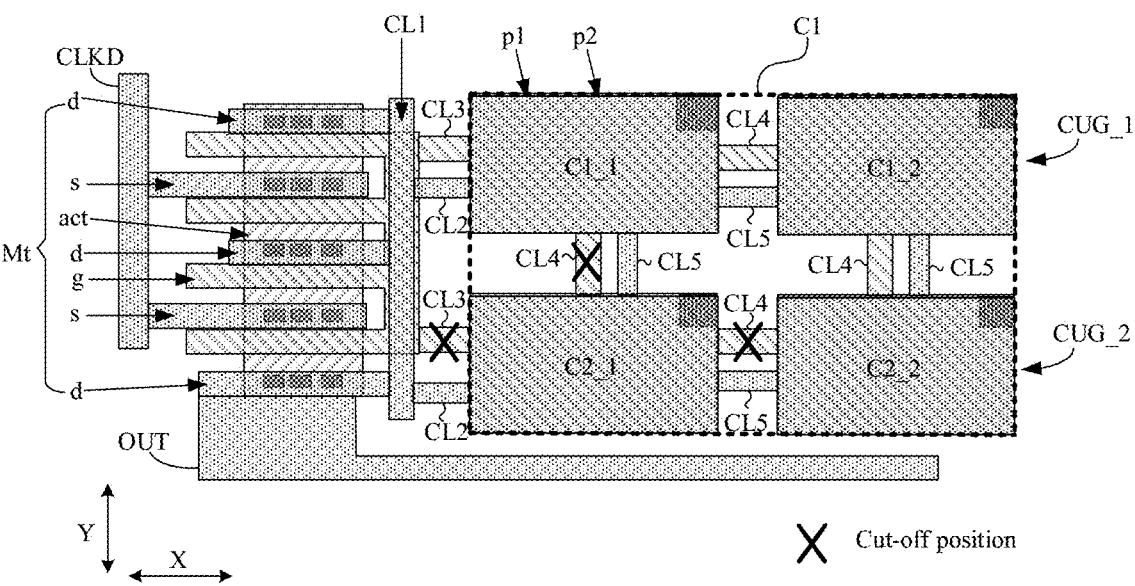
FIG. 17 is a schematic diagram illustrating the driving output circuit of FIG. 16 undergoing a maintenance process.

FIG. 17 is a schematic diagram of the driving output circuit of FIG. 16 undergoing a maintenance process. As shown in FIG. 17, taking a case where a foreign particle falls on the capacitor unit C2_1 as an example, the third conductive line CL3 and the fourth conductive line CL4 to which the first voltage writing electrode p1 of the capacitor unit C2_1 is connected may be cut off.

Figure 18:
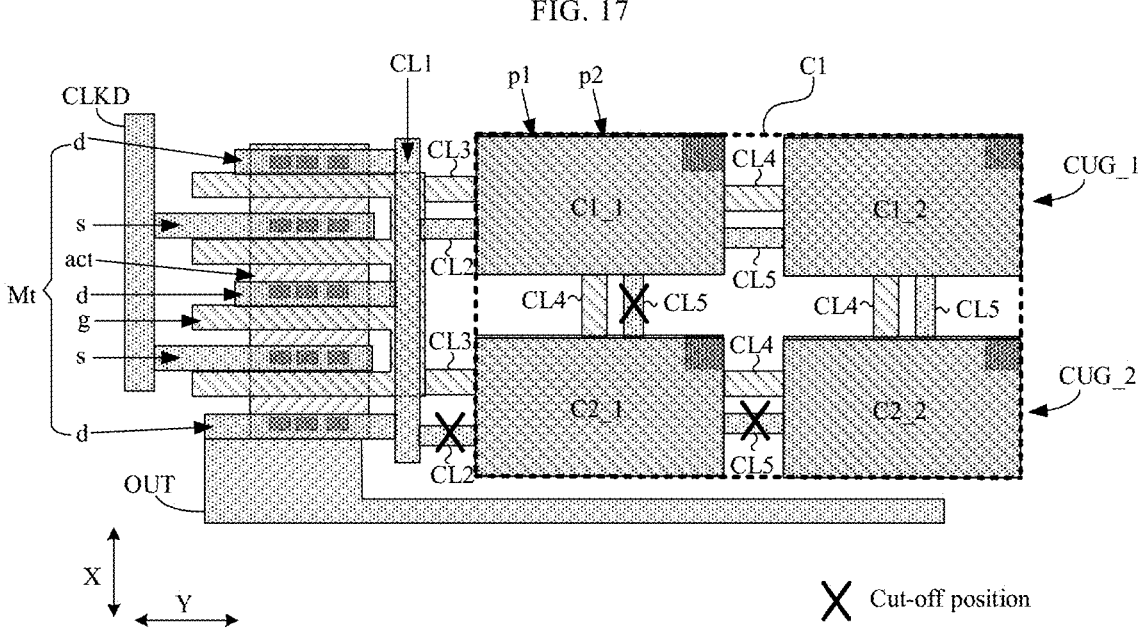
FIG. 18 is another schematic diagram illustrating the driving output circuit of FIG. 16 undergoing a maintenance process.

FIG. 18 is another schematic diagram of the driving output circuit of FIG. 16 undergoing a maintenance process. As shown in FIG. 18, taking a case where a foreign particle falls on the capacitor unit C2_1 as an example, the second conductive line CL2 and the fifth conductive line CL5 to which the second voltage writing electrode p2 of the capacitor unit C2_1 is connected may be cut off.

Referring to FIGS. 17 and 18, the capacitor units C1_1, C1_2 and C2_2 without the falling foreign particle in the capacitor structure C1 may all operate normally.

It should be noted that when the shift register includes one driving output circuit, the output control node PU in the shift register may be regarded as being located on the gate electrode of the output transistor Mt in the driving output circuit.

Figure 19:
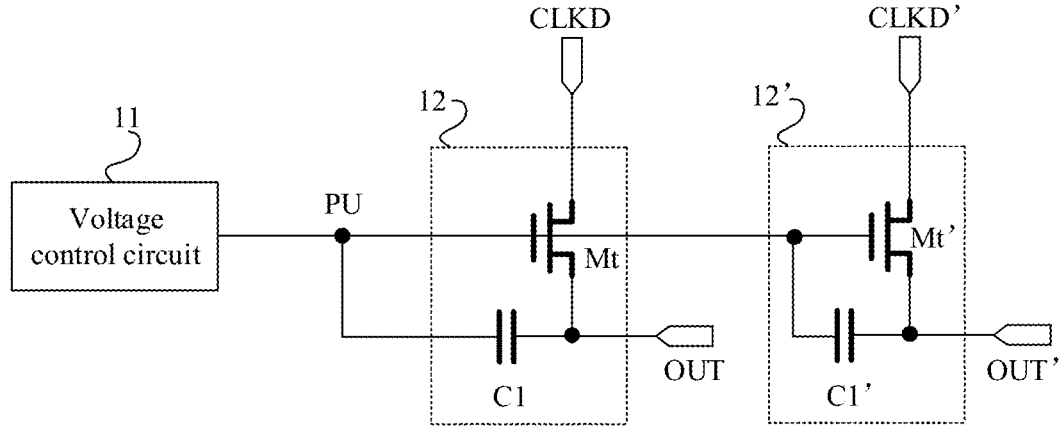
FIG. 19 is a schematic diagram of another circuit structure of a shift register according to the present disclosure.
Figure 20A:
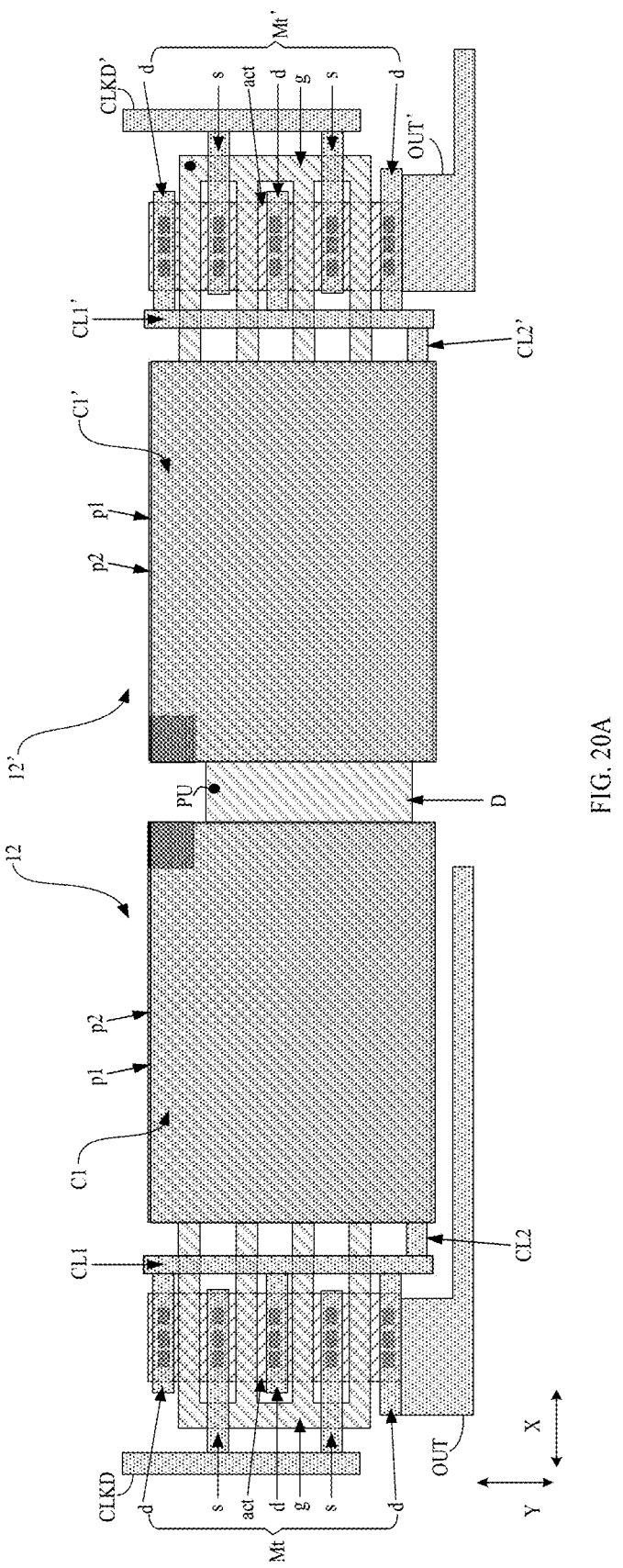
FIG. 20A is a schematic diagram of a layout of a first driving output circuit and a second driving output circuit in a shift register according to an embodiment of the present disclosure.
Figure 20C:
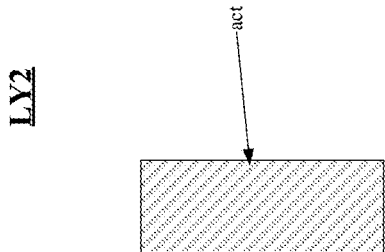
Figure 20C:
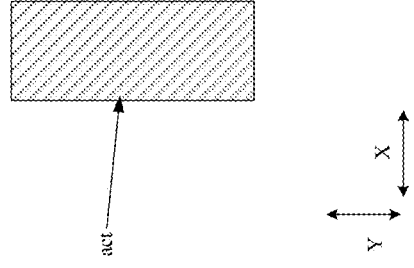
Figure 20D:
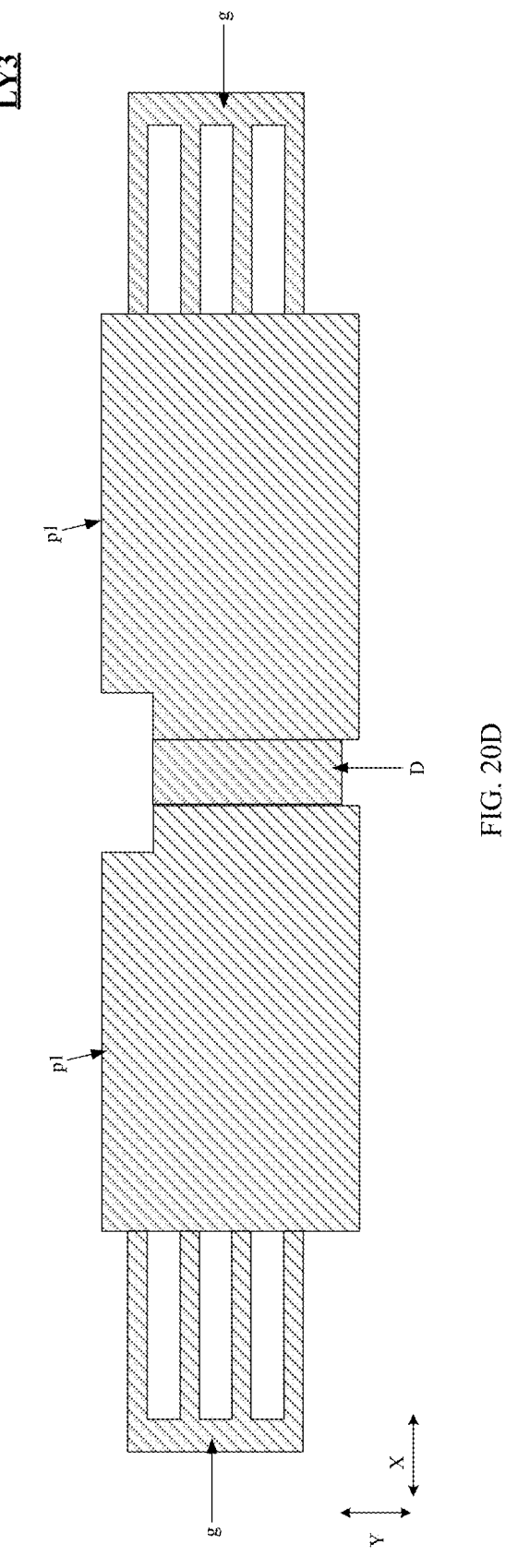
Figure 20F:
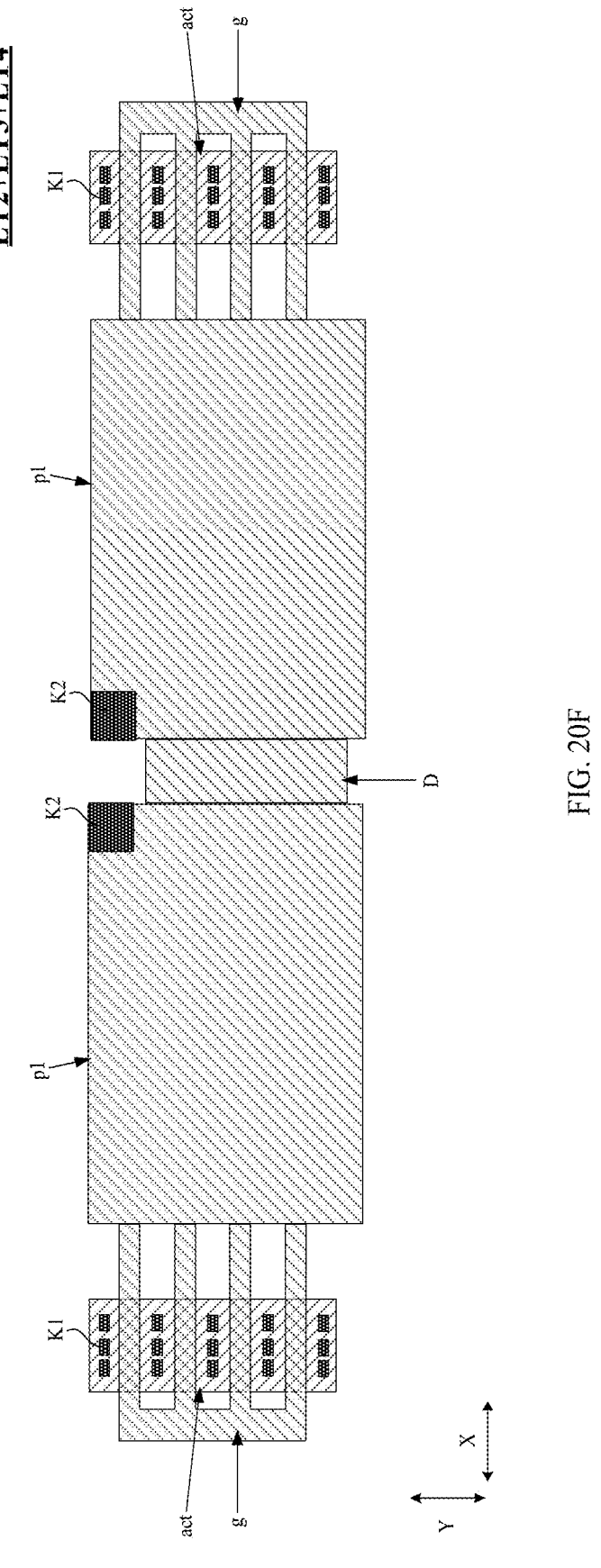
Figure 20G:
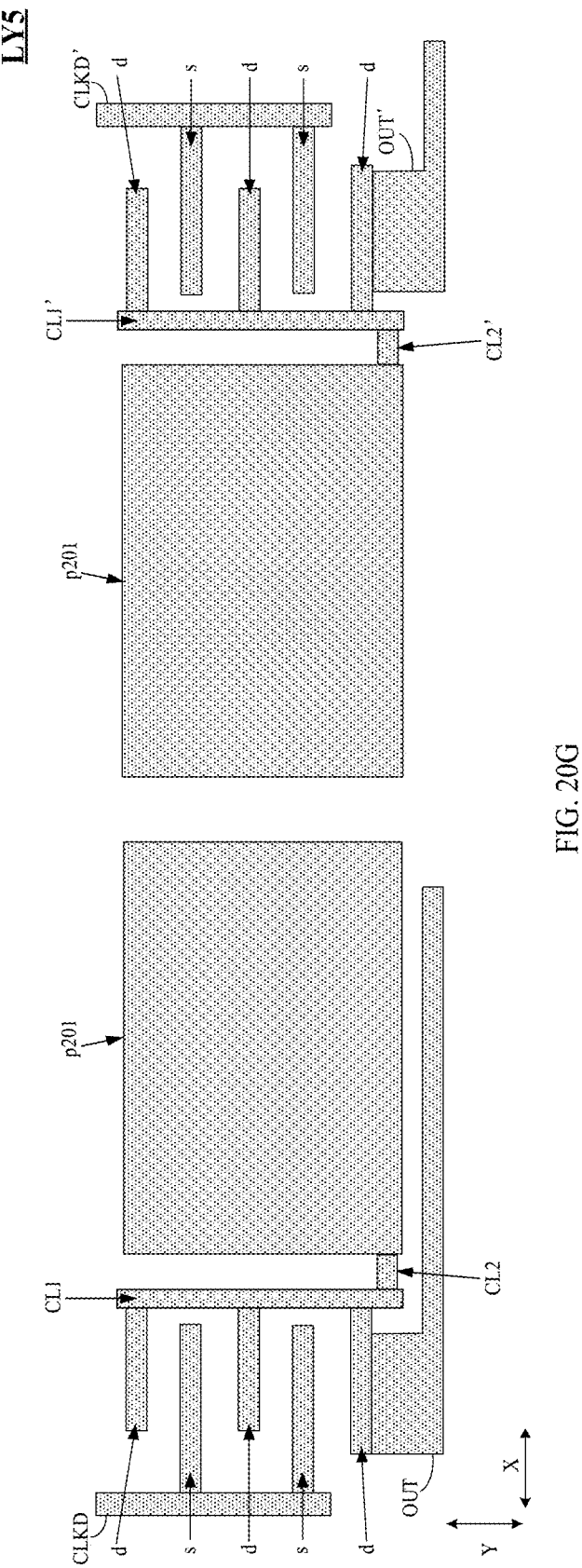

FIG. 19 is a schematic diagram of another circuit structure of a shift register according to the present disclosure; FIG. 20A is a schematic diagram of a layout of a first driving output circuit and a second driving output circuit in two driving output circuits included in a shift register according to an embodiment of the present disclosure; FIGS. 20B to 20G are schematic diagrams of layouts of layers in two driving output circuits with some layers stacked in FIG. 20A. As shown in FIGS. 19 to 20G, in some embodiments, the shift register includes two driving output circuits, including a first driving output circuit 12 and a second driving output circuit 12'; an output transistor Mt in the first driving output circuit 12, a capacitor structure C1 in the first driving output circuit 12, a capacitor structure C1' in the second driving output circuit 12', and an output transistor Mt' in the second driving output circuit 12' are sequentially arranged along the first direction X; a first voltage writing electrode p1 of the capacitor structure C1 in the first driving output circuit 12 and a first voltage writing electrode p1 of the capacitor structure C1' in the second driving output circuit 12' are coupled to each other through a conductive structure D located between the capacitor structure C1 in the first driving output circuit 12 and the capacitor structure C1' in the second driving output circuit 12'. At this time, an output control node PU in the shift register may be regarded as being located on the conductive structure D. However, the present disclosure is not limited thereto, and the shift register of the present disclosure may include more than two driving output circuits connected to each other in parallel.

In the embodiment of the present disclosure, a signal output line OUT of the first driving output circuit 12 and a signal output line OUT' of the second driving output circuit 12' may respectively provide corresponding driving signals for two different gate lines in the display region, that is, one shift register provides driving signals for two different gate lines, respectively. The details may be referred to the description for the following embodiments. In this embodiment, only the design for the circuit structures of the first driving output circuit and the second driving output circuit in the shift register will be described in detail.

In this embodiment, the configuration of the first driving output circuit 12 and the second driving output circuit 12' is the same as that of the driving output circuit shown in FIG. 6B, and will not be discussed in detail here. As shown in FIG. 19, the first voltage writing electrode p1 of the capacitor structure C1 in the first driving output circuit 12 and the first voltage writing electrode p1' of the capacitor structure C1' in the second driving output circuit 12' are connected to each other and both coupled to the output control node PU. Specifically, as shown in FIG. 20, the output control node PU may be disposed on the conductive structure D between the first voltage writing electrode p1 of the capacitor structure C1 in the first driving output circuit 12 and the first voltage writing electrode p1' of the capacitor structure C1' in the second driving output circuit 12'.

Referring to FIGS. 20A to 20G, for example, the shift register of the embodiment of the present disclosure includes a light shielding layer LY1, a first insulating layer IN1, an active layer LY2, a second insulating layer IN2, a first conductive layer LY3, a third insulating layer LY4, and a second conductive layer LY5, which are sequentially disposed in a direction away from a base substrate, as shown in FIG. 11.

FIG. 20B illustrates a layout of the light shielding layer LY1 of the first driving output circuit 12 and the second driving output circuit 12'. A material of the light shielding layer LY1 may be a conductive material (e.g., a metal material), and for example, may include a shielding pattern BK for shielding a channel region of the output transistor (in some embodiments, the channel region of the output transistor Mt may not be provided with the shielding pattern) and a second conductive pattern p202 of the second voltage writing electrode p2, as shown in FIG. 11. FIG. 20B only shows two second conductive patterns P202 respectively included in the first and second driving output circuits 12 and 12', but does not show the shielding pattern BK formed in the output transistor for shielding the channel region of the output transistor to prevent the performance of the output transistor from being affected by light. A layout of the active layer LY2 of the first driving output circuit 12 and the second driving output circuit 12' are illustrated in FIG. 20C. The active layer LY2 may include a pattern of an active layer act of the output transistor, including a channel region pattern (also referred to as a semiconductor region pattern) and a source-drain conductive region pattern. A layout of the first conductive layer LY3 of the first driving output circuit 12 and the second driving output circuit 12' are illustrated in FIG. 20D. In this embodiment, the first conductive layer LY3 may include two gate electrodes g of the first and second output transistors 12 and 12', two first voltage writing electrodes p1, and the conductive structure D coupled between the two first voltage writing electrodes p1; in this embodiment, the gate electrode g includes a third main portion GB, four third branch portions coupled to the third main portion GB and coupled to the first voltage writing electrode p1, that is, the four third branch portions of the gate electrode g extend to the first voltage writing electrode p1. As shown in FIG. 20D, the gate electrode g and the first writing voltage electrode p1 of the output transistor Mt of the first driving output circuit 12, the conductive structure D, the first writing voltage electrode p1 and the gate electrode g of the output transistor Mt of the first driving output circuit 12' are arranged sequentially along the first direction X. A layout of the third insulating layer LY4 formed on the first conductive layer LY3 in the first driving output circuit 12 and the second driving output circuit 12' is illustrated in FIG. 20E. Specifically, a distribution of a plurality of first vias K1 and a plurality of second vias K2 in the third insulating layer LY4 is illustrated, wherein the plurality of first vias K1 extend through the third insulating layer LY4 to the source-drain conductive region on the active layer LY2, and the plurality of second vias K2 extend through the third insulating layer LY4 to the second conductive pattern p202 of the second voltage writing electrode p2. In the embodiment shown in FIG. 11, the second vias K2 necessarily extend through the first insulating layer IN1, the second insulating layer IN2, the first conductive layer LY3, and the third insulating layer LY4 to the second conductive pattern p202 of the second voltage writing electrode p2. FIG. 20F illustrates a layout when the active layer LY2, the first conductive layer LY3, and the third insulating layer LY4 are stacked. FIG. 20G illustrates a layout of the second conductive layer LY5 of the first driving output circuit 12 and the second driving output circuit 12'. Specifically, the second conductive layer LY5 includes the first conductive pattern p201 of the first electrode s, the second electrode d of the first output transistor, the first conductive line CL1, the second conductive line CL2, the signal output line OUT, and the second voltage writing electrode p2, and the first conductive pattern p201 of the first electrode s, the second electrode d of the second output transistor, the first conductive line CL1', the second conductive line CL2', the signal output line OUT', and the second voltage writing electrode p2. As shown in FIG. 20G, the first electrodes s of the first and second output transistors each include two first branch portions, and the second electrodes d of the first and second output transistors each include three second branch portions, the two first branch portions and the three second branch portions of each output transistor are arranged alternately substantially along the second direction Y for the purpose of forming a four-channel transistor.

Figure 21:
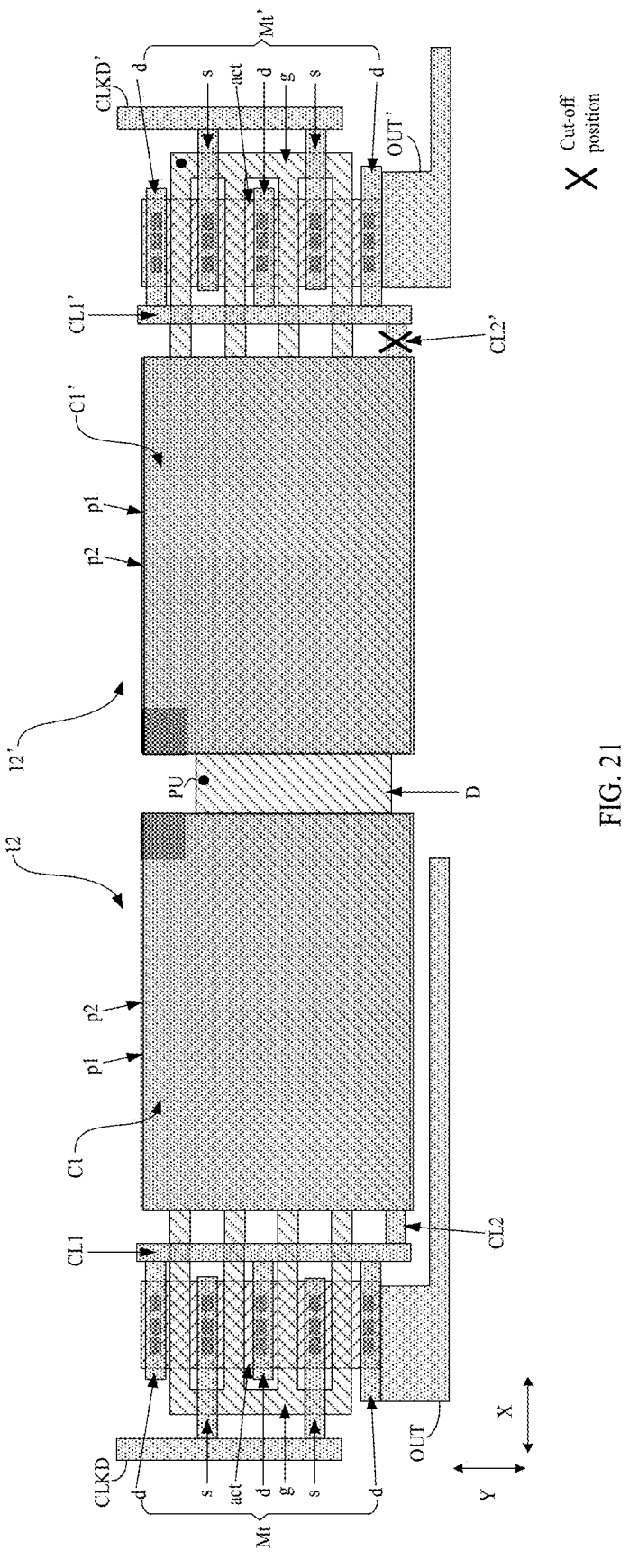
FIG. 21 is a schematic diagram illustrating a layout of the second driving output circuit in FIG. 20A undergoing a maintenance process.

FIG. 21 is a schematic diagram of a layout of the second driving output circuit in FIG. 20A undergoing a maintenance process. As shown in FIG. 21, taking a case where a foreign particle falls on the capacitor structure C1' of the second driving output circuit 12' as an example, the second conductive line CL2' configured for the capacitor structure C1' may be cut off. The capacitor structure C1 of the first driving output circuit 12 without the falling foreign particle may all operate normally, and the remaining capacitor structures C1 of the first driving output circuits may satisfy a voltage storage requirement at the output control node PU.

FIG. 22 is a schematic diagram of a layout of a first driving output circuit and a second driving output circuit in the shift register shown in FIG. 19 according to an embodiment of the present disclosure. Each of the first driving output circuit 12 and the second driving output circuit 12' is, for example, the driving output circuit shown in FIG. 16. In this embodiment, the first driving output circuit 12 and the second driving output circuit 12' are connected together through the output control node PU, as shown in FIGS. 19 and 22. As shown in FIG. 22, in some embodiments, the capacitor structures C1 and C1' in the first driving output circuit 12 and the second driving output circuit 12' each include four capacitor units C1_1, C1_2, C2_1, C2_2 connected to each other in parallel, and C1_1', C1_2', C2_1', and C2_2' connected to each other in parallel; the first voltage writing electrode p1 of each capacitor unit is coupled to the gate electrode g of the output transistor Mt, and the second voltage writing electrode p2 of each capacitor unit is coupled to the signal output line (OUT and OUT' shown in FIG. 22) configured for the corresponding driving output circuit. In the capacitor structure C1 of the first driving output circuit 12 and the capacitor structure C1' of the second driving output circuit 12', all the capacitor units may be divided into at least two capacitor unit groups arranged along the first direction X, each including at least one capacitor unit. In the embodiment shown in FIG. 22, in each of the capacitor structures C1 of the first driving output circuit 12 and the capacitor structure C1' of the second driving output circuit 12', all the capacitor units may be divided into two capacitor unit groups arranged along the second direction Y, each including two capacitor units arranged along the first direction X, that is, each capacitor structure includes capacitor units in a 2×2 array.

The first driving output circuit 12 includes four capacitor units, that is, the first capacitor units C1_1, C1_2, C2_1 and C2_2, and the second driving output circuit 12' includes four capacitor units, that is, the second capacitor units C1_1', C1_2', C2_1', C2_2'; for any first capacitor unit and any second capacitor unit adjacent to each other in the first direction X, the first voltage writing electrode p1 of the first capacitor unit and the first voltage writing electrode p1 of the adjacent second capacitor unit are electrically connected to each other by a sixth conductive line CL6 between the first capacitor unit and the second capacitor unit adjacent to each other; in this embodiment, the conductive structure D includes the sixth conductive line CL6.

In the embodiment shown in FIG. 22, each driving output circuit includes capacitor units in a 2×2 array. In each driving output circuit, the first voltage writing electrodes p1 of every two adjacent capacitor units are coupled to each other through the fourth conductive line CL4, and the second voltage writing electrodes p2 of every two adjacent capacitor units are coupled to each other through the fifth conductive line CL5. As shown in FIG. 22, the sixth conductive line CL6 and the fourth conductive line CL4 may be disposed in the same layer as the third conductive line CL3 and the gate electrode g; and the fifth conductive line CL5 and the second conductive line CL2 may be disposed in the same layer as the first conductive line CL1, the first electrode s and the second electrode d, and the output signal line OUT.

However, the present disclosure is not limited thereto, and the capacitor structures within the first and second driving output circuits 12 and 12' each may alternatively include other numbers of capacitor units connected to each other in parallel.

In some embodiments, the sixth conductive line CL6 may be disposed in the same layer as the gate electrode g of the output transistor Mt. Based on this design, the provision of the sixth conductive line CL6 cannot increase the number of manufacturing processes.

It should be noted that when the first driving output circuit 12 and the second driving output circuit 12' are included in the shift register, the capacitor structure C1 in the first driving output circuit 12 and the capacitor structure C1' in the second driving output circuit 12' may be independently selected from, for example, the capacitor structures shown in FIG. 6A, FIG. 6B, FIG. 7, FIG. 12A, FIG. 12B, FIG. 14, and FIG. 16 in the foregoing embodiments.

FIG. 22 exemplarily shows that the capacitor structure C1 in the first driving output circuit 12 and the capacitor structure C1' in the second driving output circuit 12' both adopt the capacitor structure shown in FIG. 16, which is merely exemplary, and does not limit the technical solution of the present disclosure.

Figure 23:
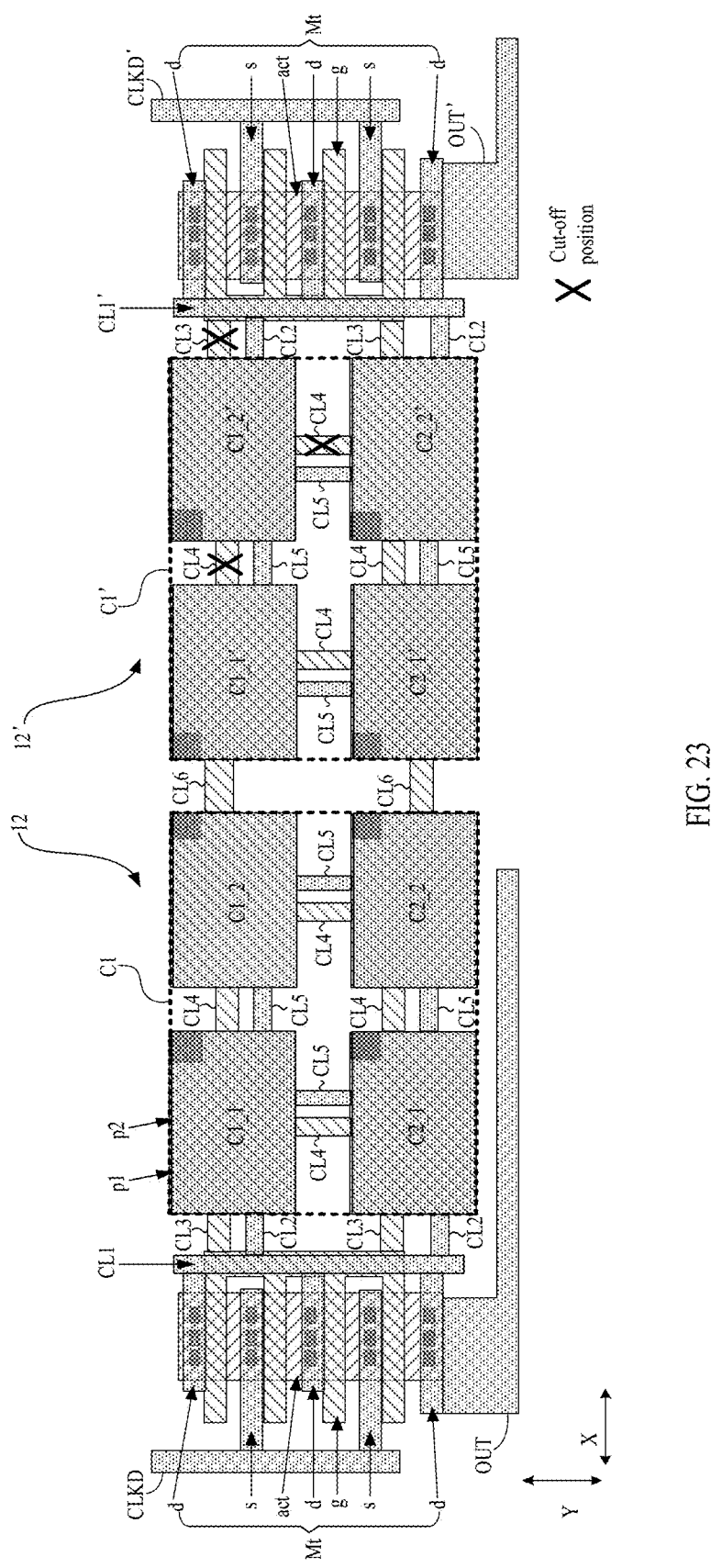
FIG. 23 is a schematic diagram illustrating the second driving output circuit shown in FIG. 22 undergoing a maintenance process.

FIG. 23 is a schematic diagram of the second driving output circuit shown in FIG. 22 undergoing a maintenance process. As shown in FIG. 23, taking a case where a foreign particle falls on the capacitor unit C1_2' as an example, the third conductive line CL3 and the two fourth conductive lines CL4 connected to the first voltage writing electrode p1 of the capacitor unit C1_2' is may be cut off.

Figure 24:
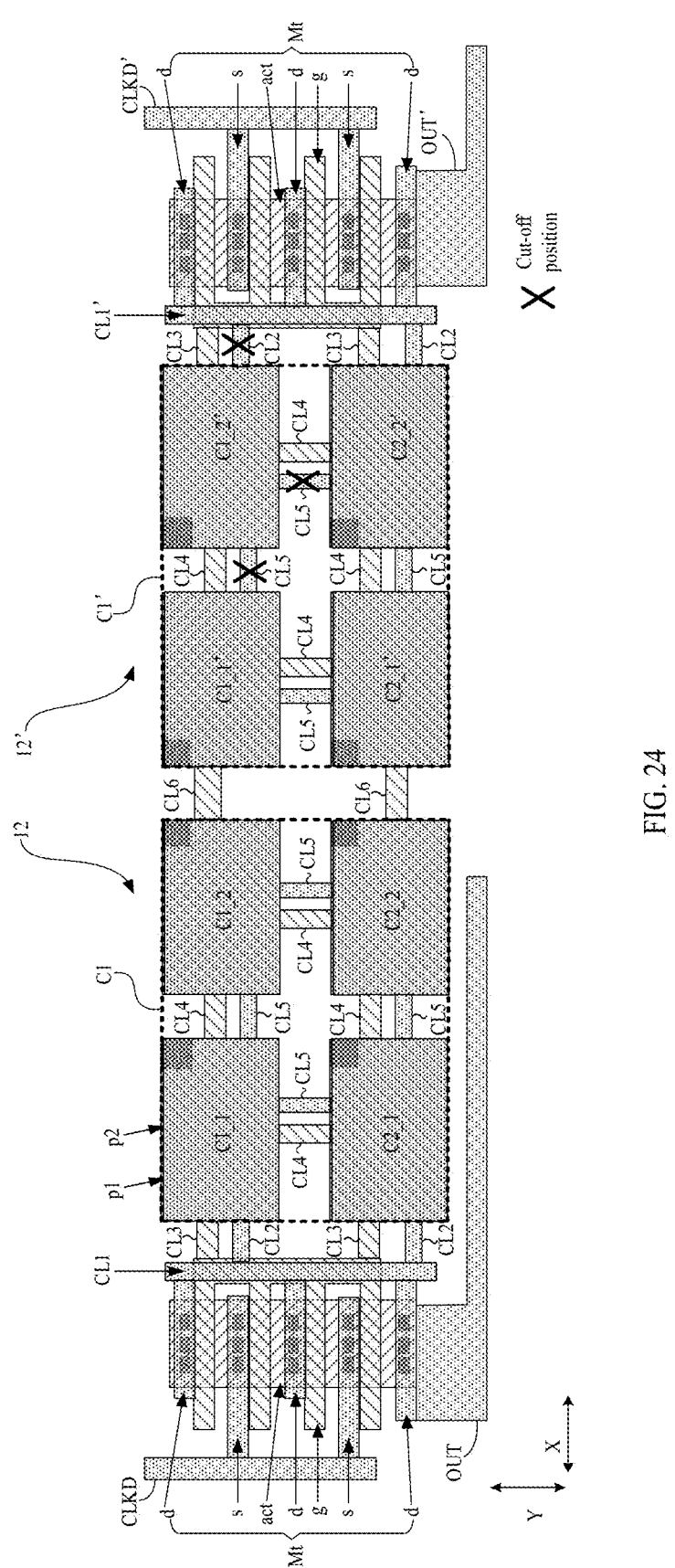
FIG. 24 is a schematic diagram illustrating the second driving output circuit shown in FIG. 22 undergoing a maintenance process.

FIG. 24 is a schematic diagram of the second driving output circuit shown in FIG. 22 undergoing a maintenance process; as shown in FIG. 24, taking a case where a foreign particle falls on the capacitor unit C1_2' as an example, the second conductive line CL2 and the two fifth conductive lines CL5 connected to the second voltage writing electrode p2 of the capacitor unit C1_2' may be cut off.

Figure 25:
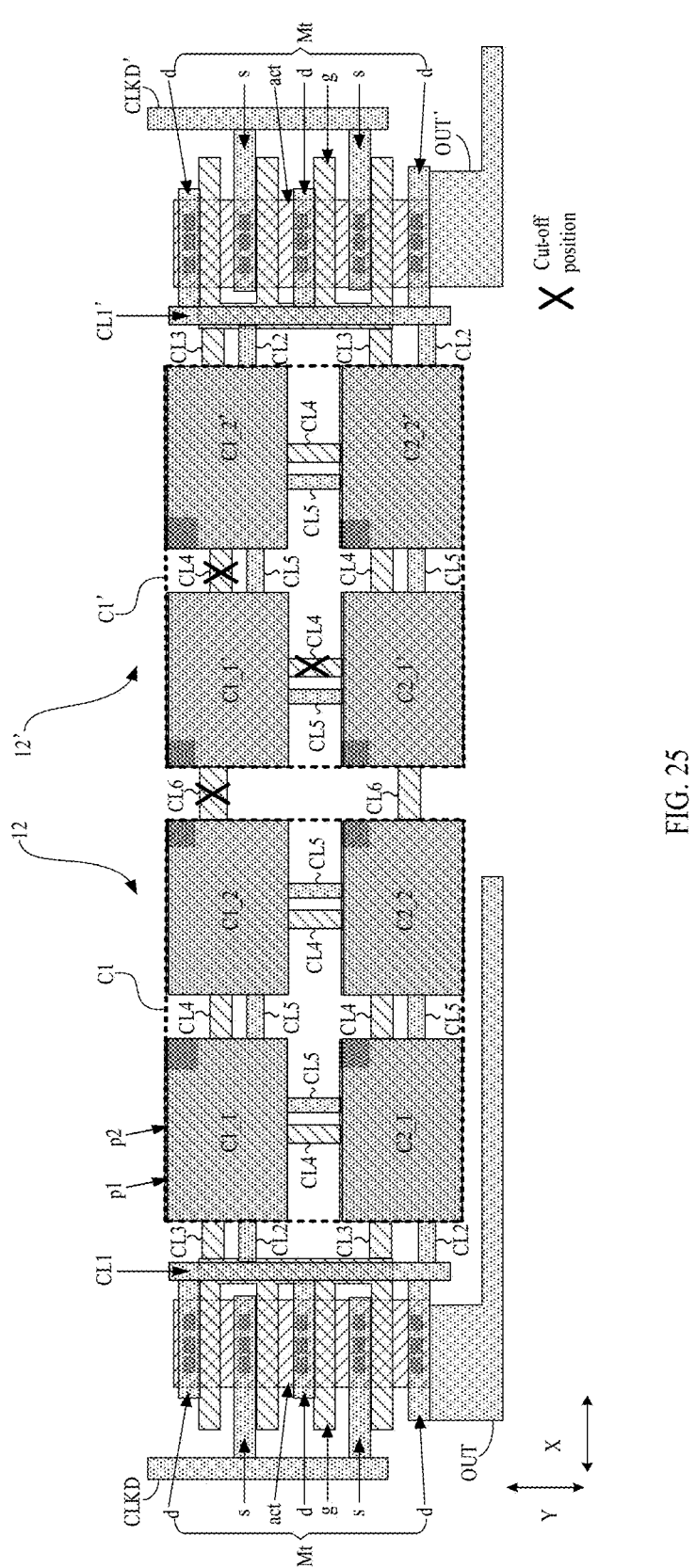
FIG. 25 is a schematic diagram illustrating the second driving output circuit shown in FIG. 22 undergoing a maintenance process.

FIG. 25 is a schematic diagram of the second driving output circuit shown in FIG. 22 undergoing a maintenance process; as shown in FIG. 25, taking a case where a foreign particle falls on the capacitor unit C1_1' as an example, two fourth conductive lines CL4 and the sixth conductive line CL6 connected to the first voltage writing electrode p1 of the capacitor unit C1_1' may be cut off.

Figure 26:
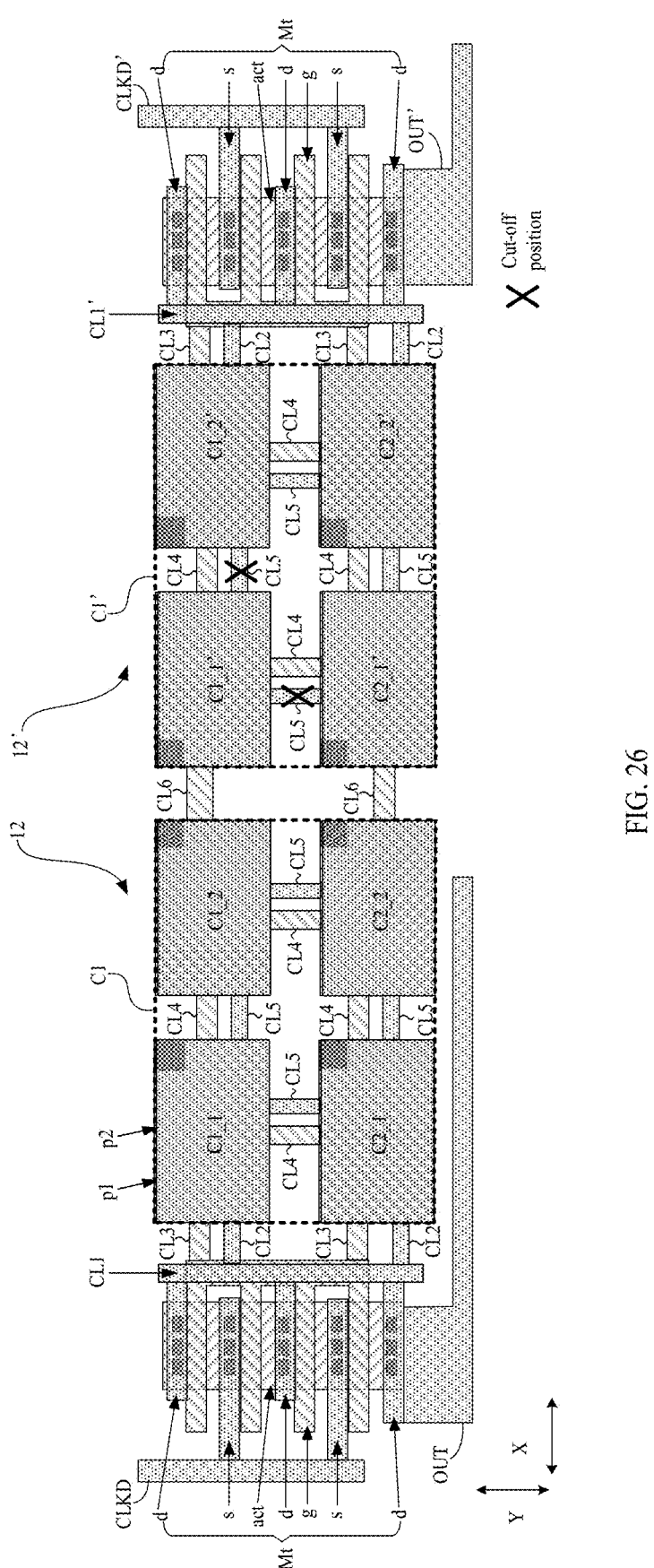
FIG. 26 is a schematic diagram illustrating the second driving output circuit shown in FIG. 22 undergoing a maintenance process.

FIG. 26 is a schematic diagram of the second driving output circuit shown in FIG. 22 undergoing a maintenance process; as shown in FIG. 26, taking a case where a foreign particle falls on the capacitor unit C1_1' as an example, the two fifth conductive lines CL5 connected to the second voltage writing electrode p2 of the capacitor unit C1_1' may be cut off.

The embodiment of the present disclosure further provides a gate driving circuit, including a plurality of shift registers, and at least one shift register adopts the shift register provided in the foregoing embodiments. For the specific description of the shift register, reference may be made to the contents in the foregoing embodiments, and details are not repeated here.

Figure 27:
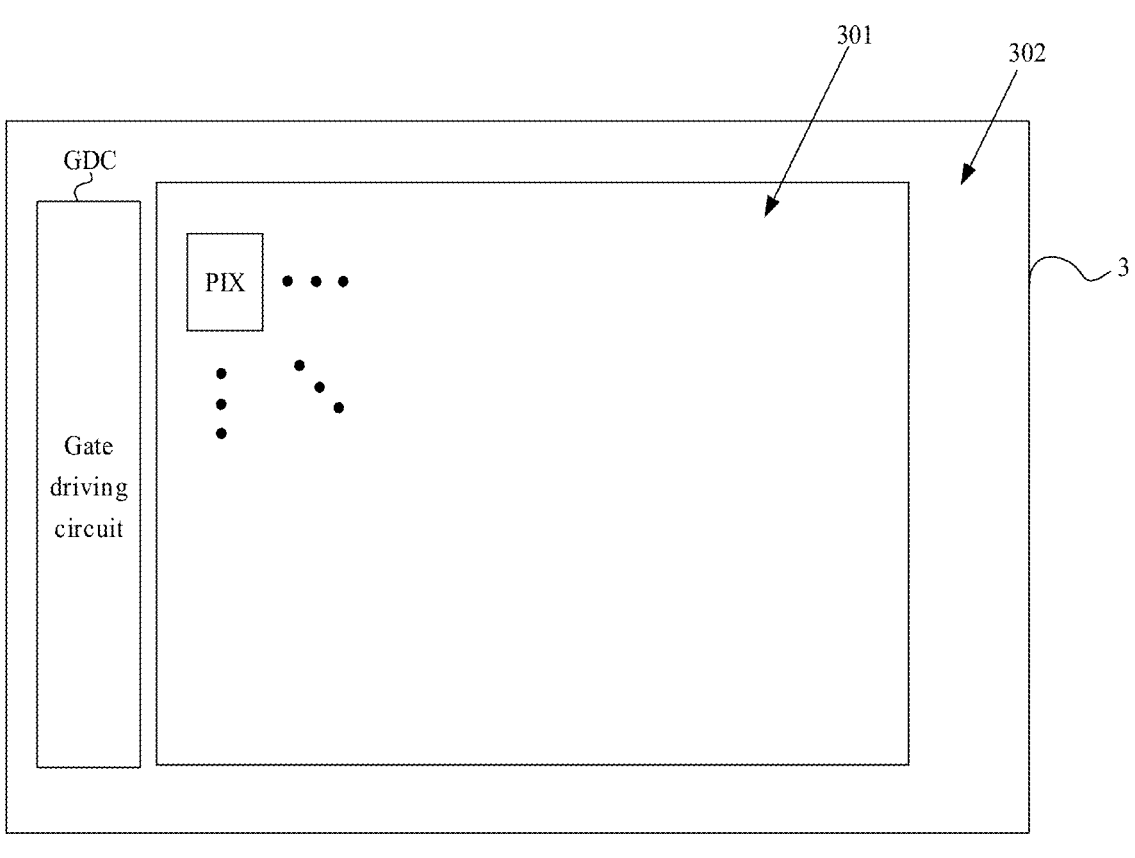
FIG. 27 is a schematic diagram of a structure of a display substrate according to an embodiment of the present disclosure.

FIG. 27 is a schematic diagram of a structure of a display substrate according to an embodiment of the present disclosure. As shown in FIG. 27, the display substrate includes a base substrate 3, the base substrate 3 includes a display region 301 and a peripheral region 302 surrounding the display region 301; pixel units PIX in an array are disposed in the display region 301, and a gate driving circuit GDC for providing driving signals to the pixel units PIX is disposed in the peripheral region 302, wherein the gate driving circuit GDC may adopt the gate driving circuit provided in the foregoing embodiment.

Figure 28:
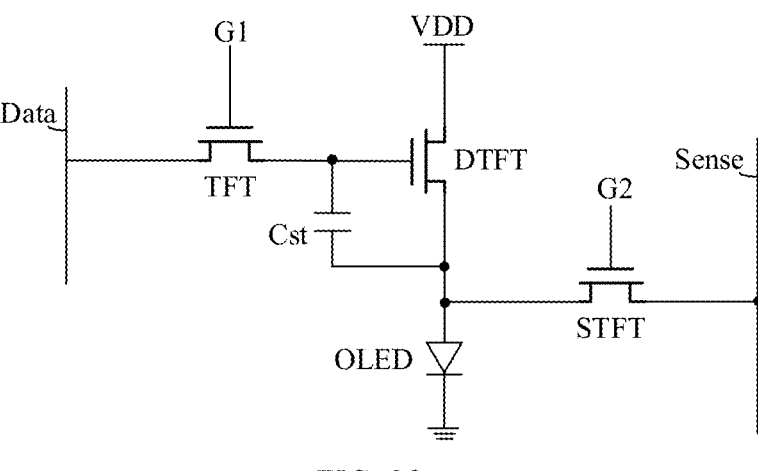
FIG. 28 is a schematic diagram of a circuit structure of a pixel unit according to an embodiment of the present disclosure.

FIG. 28 is a schematic diagram of a circuit structure of a pixel unit according to an embodiment of the present disclosure. As shown in FIG. 28, each pixel unit PIX includes a pixel circuit and a light emitting device OLED, wherein the pixel circuit includes a display switching transistor TFT (a gate electrode of which is connected to the first gate line G1), a driving transistor DTFT, a sensing switching transistor STFT (a gate electrode of which is connected to the second gate line G2), and a storage capacitor Cst. An operating process of the pixel circuit at least includes the following two stages: a pixel display driving stage (including a data voltage writing process) and a pixel sensing stage (including a current reading process).

In the pixel display driving stage, a data voltage Vdata in a data line Data is written into the pixel unit; in the pixel sensing stage, a test voltage Vsense is written to the pixel unit through the data line Data, and an electrical signal at a drain electrode of the driving transistor DTFT is read to a signal read line Sense through the sensing switching transistor STFT. In both the data voltage writing process and the current reading process, an active level voltage is written to a gate electrode of the sensing switching transistor STFT through the corresponding gate line G2.

It should be noted that the process of performing external compensation on the pixel units in the display substrate belongs to the common technology in the art, and the specific compensation process and principle are not described herein again.

Figure 29:
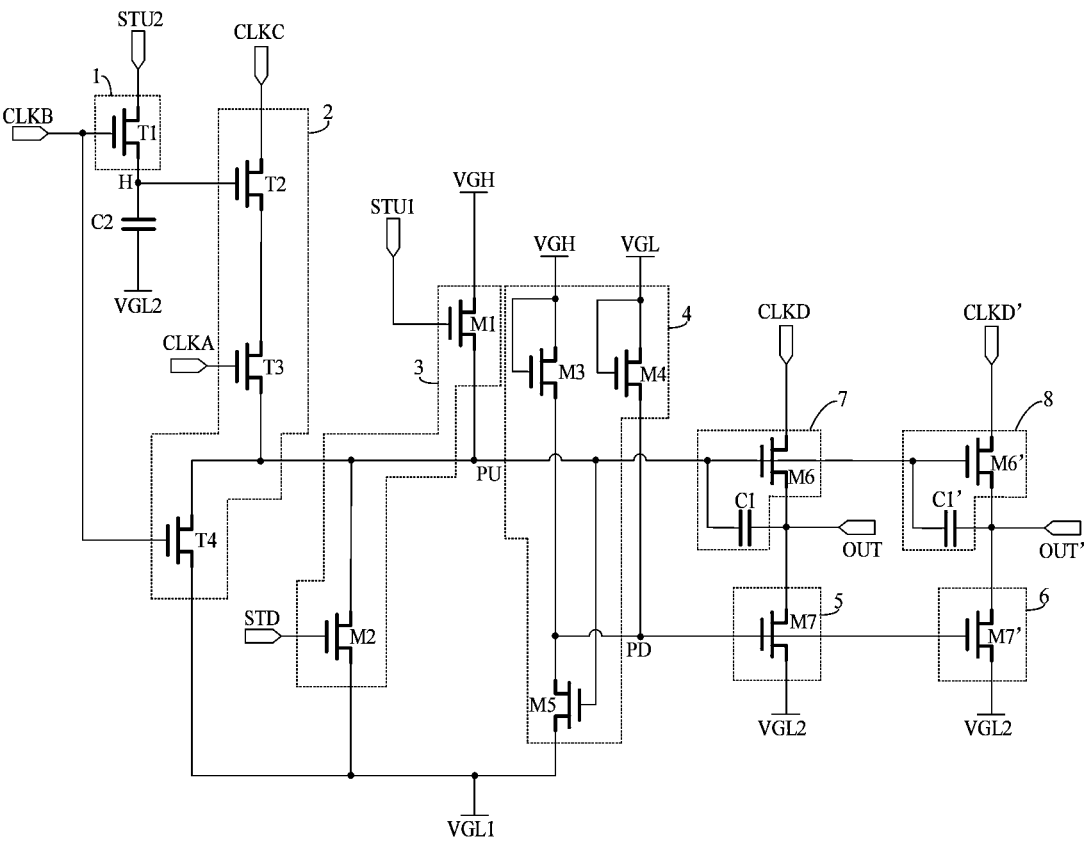
FIG. 29 is a schematic diagram of a circuit structure of a shift register according to an embodiment of the present disclosure.
Figure 30:
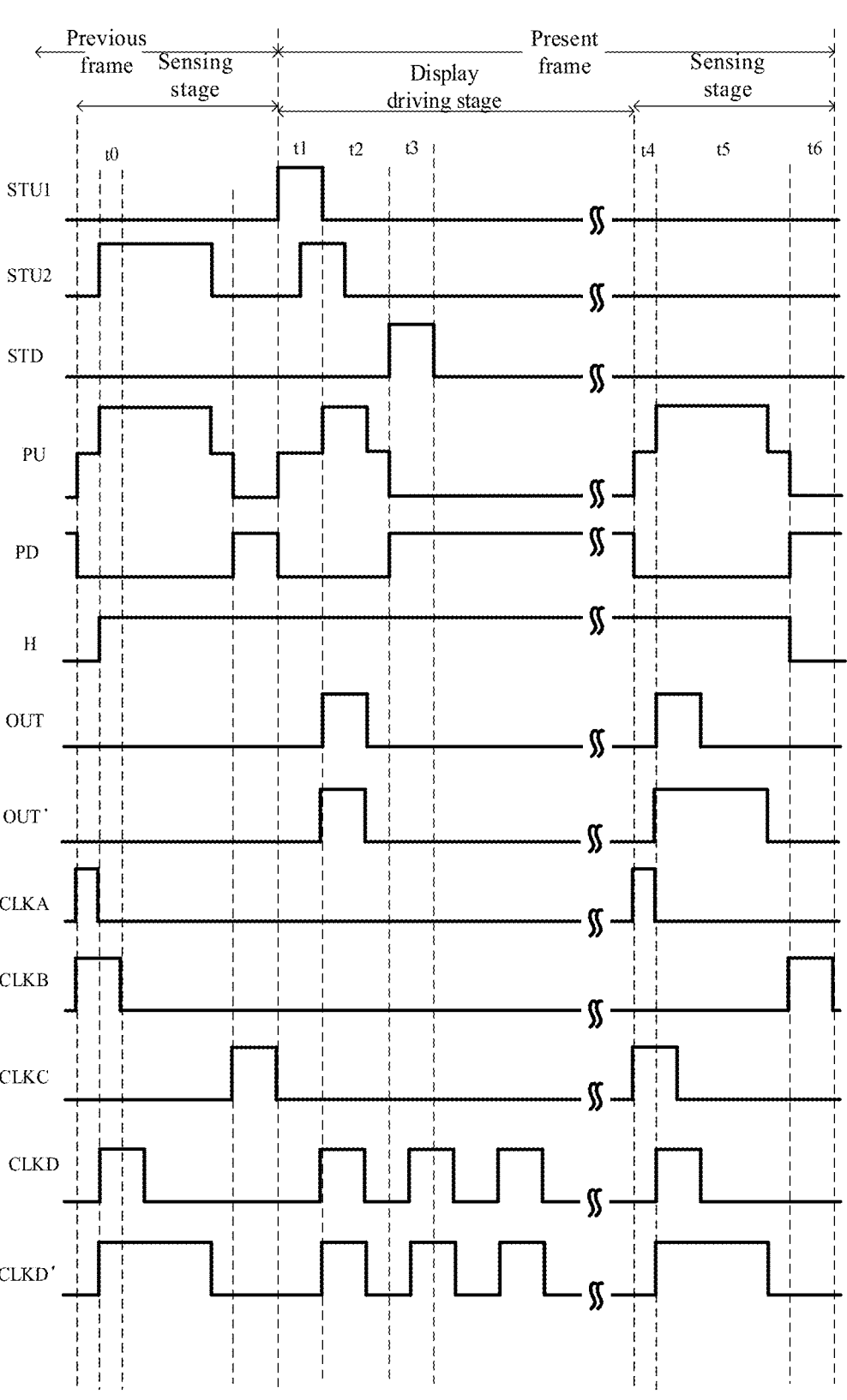
FIG. 30 is a timing of an operation of the shift register shown in FIG. 29.

FIG. 29 is a schematic diagram of a circuit structure of a shift register according to an embodiment of the present disclosure; and FIG. 30 is a timing of an operation of the shift register shown in FIG. 29. As shown in FIG. 29 and FIG. 30, in order to provide corresponding driving signals to the first gate line G1 and the second gate line G2 of the pixel unit shown in FIG. 28 by the shift register, respectively, the shift register necessarily includes at least the first driving output circuit and the second driving output circuit in the foregoing embodiment. In one or more embodiments, as shown in FIG. 29, the shift register includes a first driving output circuit 7 and a second driving output circuit 8; the signal output line OUT configured for the first driving output circuit 7 is connected to the first gate line G1 and is configured to provide a first driving signal to the first gate line G1; and the signal output line OUT' configured for the second driving output circuit 8 is connected to the second gate line G2 and is configured to provide a second driving signal to the second gate line G2.

In some embodiments, as shown in FIG. 29, in addition to the first driving output circuit 7 and the second driving output circuit 8, the voltage control circuit of the shift register may include: a display pre-charge reset circuit 3, a sensing cascade circuit 1, a sensing pre-charge reset circuit 2, an inverter circuit 4, a first output reset circuit 5 and a second output reset circuit 6, wherein the sensing cascade circuit 1 and the sensing pre-charge reset circuit 2 are coupled to a sensing cascade node H; the display pre-charge reset circuit 3, the sensing pre-charge reset circuit 2, the first driving output circuit 7 and the second driving output circuit 8 are coupled to the output control node PU; the inverter circuit 4, the first output reset circuit 5 and the second output reset circuit 6 are coupled to a pull-down node PD; the first output reset circuit 5 is further coupled to the signal output line OUT configured for the first driving output circuit 7, and the second output reset circuit 6 is further coupled to the signal output line OUT' configured for the second driving output circuit 8.

The display pre-charge reset circuit 3 is coupled to a first signal input terminal STU1, a reset signal terminal STD, a first power supply terminal VGH, and a second power supply terminal VGL1, and is configured to write a first operating voltage in an active level state provided by the first power supply terminal VGH to the output control node PU in response to control of a first input signal provided by the first signal input terminal STU1 in a display pre-charge stage t1 (as shown in FIG. 30), and to write a second operating voltage in an inactive level state provided by the second power supply terminal VGL1 to the output control node PU in response to control of a reset signal provided by the reset signal terminal STD in a display reset stage.

The sensing cascade circuit 1 is connected to a second signal input terminal STU2 and a second clock signal terminal CLKB, and is configured to write a second input signal in an active level state provided by the second signal input terminal STU2 to the sensing cascade node H in response to control of a second clock signal provided by the second clock signal terminal CLKB in a sensing cascade stage t0 (as shown in FIG. 30).

The sensing pre-charge reset circuit 2 is connected to the first clock signal terminal CLKA, a third clock signal terminal CLKC, and the second power supply terminal VGL1, and is configured to write a third clock signal in an active level state provided by the third clock signal terminal CLKC to the output control node PU in response to control of a voltage at the sensing cascade node H and a first clock signal provided by the first clock signal terminal CLKA in a sensing pre-charge stage t4 (shown in FIG. 30), and write a second operating voltage in an inactive level state provided by the second power supply terminal VGL1 to the output control node PU in response to control of a second clock signal provided by the second clock signal terminal CLKB in a sensing reset stage t6 (shown in FIG. 30).

The inverter circuit 4 is configured to invert a voltage at the output control node PU and output the inverted voltage to the pull-down node PD.

The first and second driving output circuits 7 and 8 are each configured to write a clock signal provided by the corresponding clock signal line CLKD/CLKD' to the corresponding signal output line OUT/OUT' in response to control of a voltage in an active level state at the output control node PU in a display output stage t2 and a sensing output stage t5 (as shown in FIG. 30).

The first output reset circuit 5 and the second output reset circuit 6 are each configured to write a reset operating voltage in an inactive level state provided by the reset power source terminal VGL2 to the corresponding signal output line OUT/OUT' in response to control of a voltage in an active level state at the pull-down node PD in a display reset stage t3 and a sensing reset stage t5 (shown in FIG. 30).

In some embodiments, the display pre-charge reset circuit 3 includes: a first display transistor M1 and a second display transistor M2, wherein a gate electrode of the first display transistor M1 is connected to the first signal input terminal STU1, the first electrode of the first display transistor M1 is connected to the first power supply terminal VGH, and the second electrode of the first display transistor M1 is connected to the output control node PU; a gate electrode of the second display transistor M2 is connected to the signal reset terminal STD, a first electrode of the second display transistor M2 is connected to the output control node PU, and a second electrode of the second display transistor M2 is connected to the second power source terminal VGL1, i.e., the second electrode of the first transistor M1 and the first electrode of the second transistor M2 are both coupled to the output control node PU. In some embodiments, the inverter circuit 4 includes: a third display transistor M3, a fourth display transistor M4, and a fifth display transistor M5, wherein a gate electrode and a first electrode of the third display transistor M3 are both coupled to the first power terminal VGH, and a second electrode of the third display transistor M3 is coupled to the pull-down node PD; a gate electrode and a first electrode of the fourth transistor M4 are both coupled to the third power supply terminal VGL, and a second electrode of the fourth transistor M4 is coupled to the pull-down node PD; a gate electrode of the fifth transistor M5 is coupled to the output control node PU, a first electrode of the fifth transistor M5 is coupled to the pull-down node PD, and a second electrode of the fifth transistor M5 is coupled to the second power source terminal VGL1. In some embodiments, the first driving output circuit 7 includes a sixth display transistor M6 (i.e., the output transistor Mt described above) and a capacitor structure C1, a first voltage writing electrode p1 of the capacitor structure C1 and a gate electrode of the sixth display transistor M6 are connected together and coupled to the output control node PU, a second voltage writing electrode p2 of the capacitor structure C1 and a second electrode of the sixth display transistor M6 are both connected to the signal output line OUT, and a first electrode of the sixth display transistor M6 is connected to the clock signal line CLKD; the second driving output circuit 8 includes a sixth display transistor M6' (i.e., the output transistor Mt described above) and a capacitor structure C1', a first voltage writing electrode p1 of the capacitor structure C1' and a gate electrode of the sixth display transistor M6' are connected together and coupled to the output control node PU, a second voltage writing electrode p2 of the capacitor structure C1' and a second electrode of the sixth display transistor M6' are both connected to the signal output line OUT', and a first electrode of the sixth display transistor M6 is connected to a clock signal line CLKD'. In some embodiments, the first output reset circuit 5 includes a seventh display transistor M7, a gate electrode of the seventh display transistor M7 is coupled to the pull-down node PD, a first electrode of the seventh display transistor M7 is coupled to the signal output line OUT, and a second electrode of the seventh display transistor M7 is coupled to the reset power supply terminal VGL2; the second output reset circuit 6 includes a seventh display transistor M7', a gate electrode of the seventh display transistor M7' is coupled to the pull-down node PD, a first electrode of the seventh display transistor M7' is coupled to the signal output line OUT', and a second electrode of the seventh display transistor M7' is coupled to the reset power source terminal VGL2.

In some embodiments, the sensing cascade circuit 1 includes: a first sensing transistor T1, wherein a gate electrode of the first sensing transistor T1 is coupled to the second clock signal terminal CLKB, a first electrode of the first sensing transistor T1 is coupled to the second signal input terminal STU2, and a second electrode of the first sensing transistor T1 is coupled to the sensing cascade node H; the sensing pre-charge reset circuit 2 includes: a second sensing transistor T2, a third sensing transistor T3, and a fourth sensing transistor T4, wherein a gate electrode of the second sensing transistor T2 is connected to the sensing cascade node H, and a first electrode of the second sensing transistor T2 is coupled to the third clock signal terminal CLKC; a gate electrode of the third sensing transistor T3 is coupled to the first clock signal terminal CLKA, and a second electrode of the third sensing transistor T3 is coupled to the output control node PU; a second electrode of the second sensing transistor T2 is coupled to a first electrode of the third sensing transistor T3; a gate electrode of the fourth sensing transistor T4 is coupled to the second clock signal terminal CLKB, a first electrode of the fourth sensing transistor T4 is coupled to the output control node PU, and a second electrode of the fourth sensing transistor T4 is coupled to the second power source terminal VGL1.

The first sensing transistor T1, the second sensing transistor T2, the third sensing transistor T3, the fourth sensing transistor T4, the first display transistor M1, the second display transistor M2, the third display transistor M3, the fourth display transistor M4, the fifth display transistor M5, the sixth display transistors M6/M6' and the seventh display transistors M7/M7' may all be N-type transistors or all be P-type transistors according to actual needs, or a part of the transistors may be N-type transistors and the rest may be P-type transistors.

The operating process of the shift register may include the following 7 stages: the sensing cascade stage t0 (in a sensing stage of the previous frame), the display pre-charge stage t1, the display output stage t2, the display reset stage t3, the sensing pre-charge stage t4, the sensing output stage t5, and the sensing reset stage t6. The specific operation process of the shift register at the stages may be performed according to the operation timing shown in FIG. 30, and is not described in detail here.

It should be noted that FIG. 29 only shows an optional implementation of the voltage control circuit in the shift register according to the embodiment of the present disclosure, which does not limit the technical solution of the present disclosure; it should be understood by one of ordinary skill in the art that the voltage control circuit in the shift register may also adopt other circuit structures, which are not described by way of example. In addition, the number of the driving output circuits in the shift register in the present disclosure may be set to be 1, 2, 3, or even more according to the number of the driving signals required to be output, which is not limited in the present disclosure.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A shift register, comprising:
   a voltage control circuit coupled to an output control node and configured to control a voltage at the output control node; and
   at least one driving output circuit, each comprising: an output transistor and a capacitor structure which are arranged along a first direction, wherein the output transistor and the capacitor structure are coupled to each other through a first conductive line extending along a second direction, and the first conductive line is coupled to a signal output line configured for the driving output circuit;
   the output transistor comprises a gate electrode, a first electrode and a second electrode, the first electrode comprises a first main portion and at least one first branch portion, the second electrode comprises a second main portion and at least one second branch portion; the at least one first branch portion and the at least one second branch portion of the output transistor are alternately arranged in the second direction, the gate electrode of the output transistor is coupled to the output control node and a first voltage writing electrode of the capacitor structure, the first electrode of the output transistor is coupled to a clock signal line configured for the driving output circuit, and the second electrode of the output transistor is coupled to the first conductive line; and a second conductive line is provided between the first conductive line and the capacitor structure, and the first conductive line is coupled to a second voltage writing electrode of the capacitor structure through the second conductive line.

2. The shift register of claim 1, wherein the first conductive line is arranged between at least a part of the output transistor and the capacitor structure.

3. The shift register of claim 2, wherein an extending direction of the first conductive line is different from that of the second conductive line.

4. The shift register of claim 1, wherein the first conductive line and the second electrode of the output transistor are arranged in a same layer.

5. The shift register of claim 1, wherein the second conductive line and the first conductive line are arranged in a same layer.

6. The shift register of claim 1, wherein the capacitor structure comprises at least two capacitor units connected to each other in parallel, and first voltage writing electrodes of the at least two capacitor units are coupled to the gate of the output transistor, and second voltage writing electrodes of the at least two capacitor units are coupled to the signal output line configured for the driving output circuit.

7. The shift register of claim 6, wherein the at least two capacitor units of the capacitor structure are divided into at least two capacitor unit groups arranged along the second direction, each comprising at least one capacitor unit;

each of the at least two capacitor unit groups is configured with a corresponding second conductive line, and different capacitor unit groups correspond to different second conductive lines, respectively; and in each of the at least two capacitor unit groups, a second voltage writing electrode of the capacitor unit closest to the first conductive line is coupled to the first conductive line through the second conductive line corresponding to the capacitor unit group.

8. The shift register of claim 7, further comprising at least two third conductive lines between the output transistor and the capacitor structure and in a one-to-one correspondence with the at least two capacitor unit groups; and a first voltage writing electrode of the capacitor unit closest to the first conductive line in the capacitor unit group is coupled to the gate electrode of the output transistor through the third conductive line corresponding to the capacitor unit group.

9. The shift register of claim 8, wherein the at least two third conductive lines are in a same layer as the gate electrode of the output transistor.

10. The shift register of claim 8, wherein an extending direction of the third conductive line is different from that of the second conductive line.

11. The shift register of claim 7, wherein the at least two capacitor units of the capacitor structure are arranged in an array along the first direction and the second direction;

first voltage writing electrodes of any two adjacent capacitor units in the first direction or the second direction are coupled to each other through a fourth conductive line between the two adjacent capacitor units; and second voltage writing electrodes of any two adjacent capacitor units in the first direction or the second direction are coupled to each other through a fifth conductive line between the two adjacent capacitor units.

12. The shift register of claim 11, wherein the fourth conductive line and the gate electrode of the output transistor are arranged in a same layer; and the fifth conductive line and the second electrode of the output transistor are arranged in a same layer.

13. The shift register of claim 1, wherein the at least one driving output circuit comprises at least two driving output circuits, comprising a first driving output circuit and a second driving output circuit;

the output transistor in the first driving output circuit, the capacitor structure in the first driving output circuit, the capacitor structure in the second driving output circuit, and the output transistor in the second driving output circuit are sequentially arranged along the first direction; and a first voltage writing electrode of the capacitor structure in the first driving output circuit and a first voltage writing electrode of the capacitor structure in the second driving output circuit are coupled to each other through a conductive structure between the capacitor structure in the first driving output circuit and the capacitor structure in the second driving output circuit.

14. The shift register of claim 13, wherein the clock signal line configured for the driving output circuit comprises a portion extending along the second direction, which is on a side of the output transistor away from the capacitor structure in the driving output circuit.

15. The shift register of claim 14, wherein the first electrode of the output transistor extends along the first direction; and an end of the first electrode away from the capacitor structure is connected to the portion of the clock signal line extending along the second direction.

16. The shift register of claim 13, wherein the gate electrode of the output transistor comprises a first portion extending along the first direction and a second portion extending along the second direction, the first portion is coupled to the second portion, and the second portion is arranged on a side of the first portion away from the capacitor structure.

17. The shift register of claim 1, wherein the first voltage writing electrode is a single-layer structure; the first voltage writing electrode and the gate electrode of the output transistor are in a same layer;

the second voltage writing electrode is a single-layer structure, and the second voltage writing electrode and the second electrode of the output transistor are in a same layer; and a light shielding pattern is on a side of the output transistor, and an orthographic projection of the light shielding pattern on a base at least partially overlaps with an orthographic projection of a line, wherein the gate electrode of the output transistor is located, on the base.

18. The shift register of claim 1, wherein the at least one first branch portion comprises a plurality of first branch portions, the at least one second branch portion comprises a plurality of second branch portions, the plurality of first branch portions and the plurality of second branch portions extend along the first direction, the plurality of first branch portions are sequentially arranged along the second direction, the plurality of second branch portions are sequentially arranged along the second direction, and the plurality of first branch portions and the plurality of second branch portions are alternately arranged along the second direction; and the first main portion and the second main portion extend along the second direction.

19. A gate driving circuit, comprising: a plurality of cascaded shift registers, wherein at least one of the plurality of cascaded shift registers is the shift register of claim 1.

20. A display substrate, comprising the gate driving circuit of claim 19.

\* \* \* \* \*